United States Patent
Maruyama et al.

(10) Patent No.: US 11,693,318 B2
(45) Date of Patent: Jul. 4, 2023

(54) PHOTOSENSITIVE RESIN COMPOSITION, PHOTOSENSITIVE RESIN COATING, PHOTOSENSITIVE DRY FILM, AND BLACK MATRIX

(71) Applicant: Shin-Etsu Chemical Co., Ltd., Tokyo (JP)

(72) Inventors: Hitoshi Maruyama, Annaka (JP); Tamotsu Oowada, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 973 days.

(21) Appl. No.: 16/502,283

(22) Filed: Jul. 3, 2019

(65) Prior Publication Data

US 2020/0026190 A1    Jan. 23, 2020

(30) Foreign Application Priority Data

Jul. 17, 2018 (JP) .................................. 2018-134210

(51) Int. Cl.

| | |
|---|---|
| *C08L 63/00* | (2006.01) |
| *G03F 7/075* | (2006.01) |
| *C08K 3/04* | (2006.01) |
| *C08L 61/06* | (2006.01) |
| *C08L 61/28* | (2006.01) |
| *C08L 83/04* | (2006.01) |
| *C08L 83/16* | (2006.01) |
| *G03F 7/004* | (2006.01) |
| *G03F 7/16* | (2006.01) |

(52) U.S. Cl.
CPC .............. *G03F 7/0757* (2013.01); *C08K 3/04* (2013.01); *C08L 61/06* (2013.01); *C08L 61/28* (2013.01); *C08L 63/00* (2013.01); *C08L 83/04* (2013.01); *C08L 83/16* (2013.01); *G03F 7/0045* (2013.01); *G03F 7/16* (2013.01)

(58) Field of Classification Search
CPC ........ C08G 77/52; C08G 77/16; C08G 77/14; C08L 63/00; C08L 61/28; C08K 3/04; C09D 183/14
See application file for complete search history.

(56) References Cited

U.S. PATENT DOCUMENTS

| | | | | |
|---|---|---|---|---|
| 2002/0012873 | A1* | 1/2002 | Jung | ..................... G03F 7/0395 430/326 |
| 2005/0037210 | A1* | 2/2005 | Bertry | ....................... C08J 7/046 428/447 |
| 2006/0019197 | A1* | 1/2006 | Waldman | ............... G11B 7/246 |
| 2012/0108762 | A1 | 5/2012 | Kondo et al. | |
| 2014/0100301 | A1 | 4/2014 | Lin et al. | |
| 2016/0097973 | A1 | 4/2016 | Urano et al. | |
| 2018/0004088 | A1 | 1/2018 | Maruyama et al. | |
| 2019/0204734 | A1 | 7/2019 | Nonaka et al. | |
| 2019/0235383 | A1 | 8/2019 | Inari et al. | |

FOREIGN PATENT DOCUMENTS

| | | | |
|---|---|---|---|
| GB | 2066278 | * | 7/1981 |
| JP | 2001-51112 | A | 2/2001 |
| JP | 2003-161828 | A | 6/2003 |
| JP | 2018-2848 | A | 1/2018 |
| JP | 2018-4739 | A | 1/2018 |
| JP | 2018-28630 | A | 2/2018 |
| WO | 2018/061988 | A1 | 4/2018 |

OTHER PUBLICATIONS

Extended Search Report dated Nov. 20, 2019, issued in counterpart EP Application No. 19184086.7 (6 pages).
Office Action dated May 24, 2022, issued in counterpart JP application No. 2019-128032, with English translation. (5 pages).

* cited by examiner

*Primary Examiner* — Kuo Liang Peng
(74) *Attorney, Agent, or Firm* — WHDA, LLP

(57) ABSTRACT

A black photosensitive resin composition comprising (A) an acid crosslinkable group-containing silicone resin, (B) carbon black, and (C) a photoacid generator is coated onto a substrate to form a photosensitive resin coating which has improved reliability with respect to adhesion and crack resistance, resolution and flexibility while maintaining satisfactory light shielding properties.

17 Claims, No Drawings

PHOTOSENSITIVE RESIN COMPOSITION, PHOTOSENSITIVE RESIN COATING, PHOTOSENSITIVE DRY FILM, AND BLACK MATRIX

CROSS-REFERENCE TO RELATED APPLICATION

This non-provisional application claims priority under 35 U.S.C. § 119(a) on Patent Application No. 2018-134210 filed in Japan on Jul. 17, 2018, the entire contents of which are hereby incorporated by reference.

TECHNICAL FIELD

This invention relates to a photosensitive resin composition, photosensitive resin coating, photosensitive dry film, and black matrix.

BACKGROUND ART

As discussed in Patent Documents 1 and 2, a photosensitive resin composition capable of forming a black matrix having a fine-size pattern is desired at the color filter site in display devices in order to maintain a sufficient color purity and contrast.

Patent Document 3 discloses a black matrix-forming resist material comprising a thermosetting acrylic resin and carbon black. Display devices requiring further micro-processing, typically microLED displays emerged in recent years. There is a need for a photosensitive material complying with such advanced display devices.

One common practice taken to improve the light-shielding properties of a black matrix is to increase the content of a light-shielding component such as carbon black in a photosensitive resin composition. Increasing the content of a light-shielding component, however, gives rise to problems such as losses of resolution, flexibility, and reliability with respect to adhesion and crack resistance.

CITATION LIST

Patent Document 1: JP-A 2001-051112
Patent Document 2: JP-A 2003-161828
Patent Document 3: JP-A 2018-004739

DISCLOSURE OF INVENTION

An object of the invention is to provide a black photosensitive resin composition having improved reliability with respect to adhesion and crack resistance, resolution, and flexibility, while maintaining satisfactory light-shielding properties. Another object is to provide a photosensitive resin coating, a photosensitive dry film, and a black matrix.

The inventors have found that the above and other objects are attained by a photosensitive resin composition comprising (A) a specific silicone resin, (B) carbon black, and (C) a photoacid generator.

In one aspect, the invention provides a photosensitive resin composition comprising (A) a base resin comprising an acid crosslinkable group-containing silicone resin, (B) carbon black, and (C) a photoacid generator.

Typically, the acid crosslinkable group is a phenolic hydroxyl group or epoxy group.

In a preferred embodiment, the silicone resin comprises recurring units having the formula (a1) and recurring units having the formula (b1).

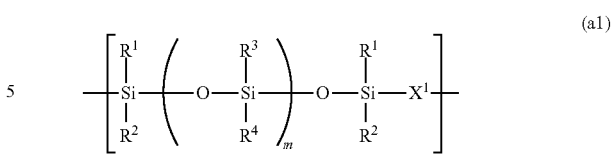

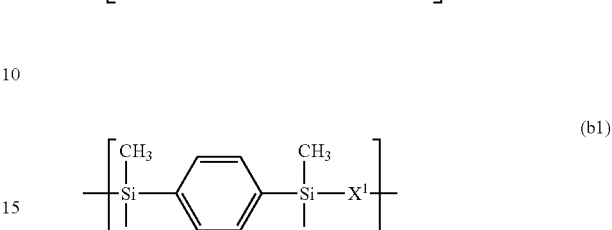

Herein $R^1$ to $R^4$ are each independently a $C_1$-$C_8$ monovalent hydrocarbon group, m is an integer of 0 to 600, and $X^1$ is a divalent group having the formula (X1):

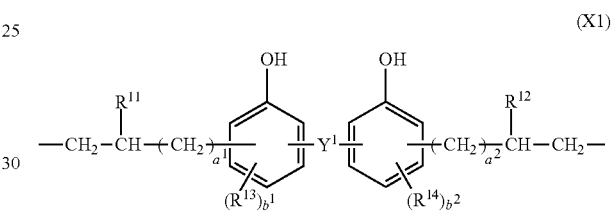

wherein $Y^1$ is a single bond, methylene, propane-2,2-diyl, 1,1,1,3,3,3-hexafluorpopane-2,2-diyl or fluorene-9,9-diyl group, $R^{11}$ and $R^{12}$ are each independently hydrogen or methyl, $R^{13}$ and $R^{14}$ are each independently a $C_1$-$C_4$ alkyl or $C_1$-$C_4$ alkoxy group, $a^1$ and $a^2$ are each independently an integer of 0 to 7, $b^1$ and $b^2$ are each independently an integer of 0 to 2.

In another preferred embodiment, the silicone resin comprises recurring units having the formula (a2) and recurring units having the formula (b2).

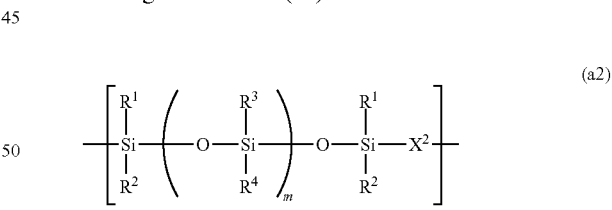

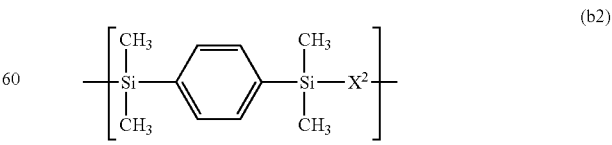

Herein $R^1$ to $R^4$ are each independently a $C_1$-$C_8$ monovalent hydrocarbon group, m is an integer of 0 to 600, and $X^2$ is a divalent group having the formula (X2):

(X2)

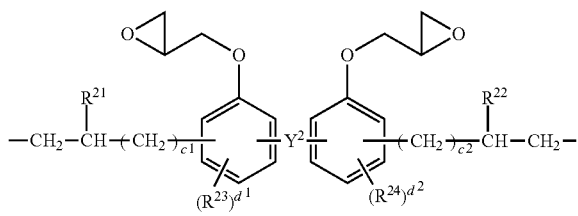

wherein $Y^2$ is a single bond, methylene, propane-2,2-diyl, 1,1,1,3,3,3-hexafluoropropane-2,2-diyl or fluorene-9,9-diyl group, $R^{21}$ and $R^{22}$ are each independently hydrogen or methyl, $R^{23}$ and $R^{24}$ are each independently a $C_1$-$C_4$ alkyl or $C_1$-$C_4$ alkoxy group, $c^1$ and $c^2$ are each independently an integer of 0 to 7, $d^1$ and $d^2$ are each independently an integer of 0 to 2.

In a further preferred embodiment, the silicone resin comprises recurring units having the formula (a1), recurring units having the formula (b1), recurring units having the formula (a2), and recurring units having the formula (b2).

(a1)

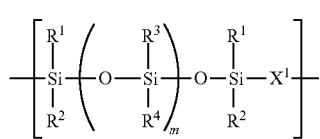

(b1)

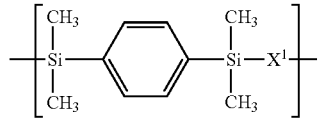

(a2)

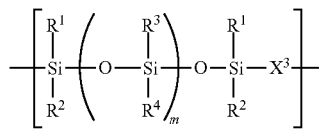

(b2)

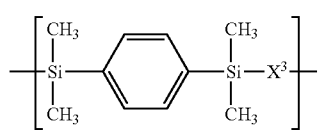

Herein $R^1$ to $R^4$, $X^1$, $X^2$, and m are as defined above.

In a preferred embodiment, the silicone resin further comprises recurring units having the formula (a3) and recurring units having the formula (b3).

(a3)

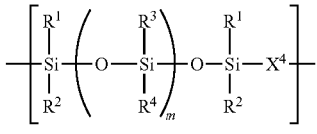

(b3)

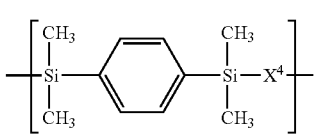

Herein $R^1$ to $R^4$ and m are as defined above, and $X^3$ is a divalent group having the formula (X3):

(X3)

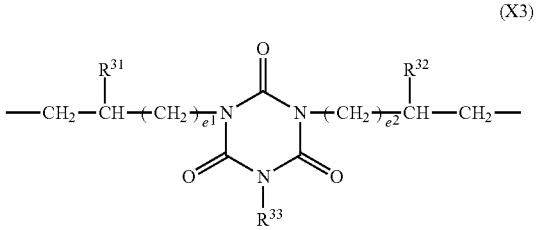

wherein $R^{31}$ and $R^{32}$ are each independently hydrogen or methyl, $e^1$ and $e^2$ are each independently an integer of 0 to 7, and $R^{33}$ is a $C_1$-$C_8$ monovalent hydrocarbon group which may contain an ester bond or ether bond, or a monovalent group having the formula (X3-1):

(X3-1)

wherein $R^3$ is a $C_1$-$C_8$ divalent hydrocarbon group which may contain an ester bond or ether bond.

In a preferred embodiment, the silicone resin further comprises recurring units having the formula (a4) and recurring units having the formula (b4).

(a4)

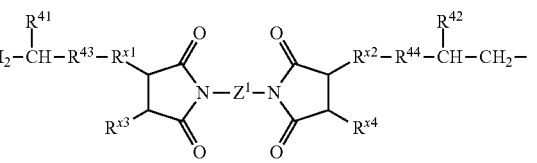

(b4)

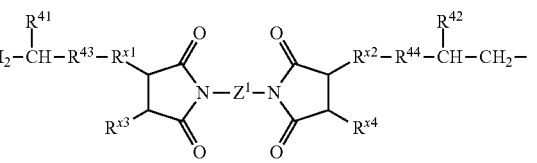

Herein $R^1$ to $R^4$ and m are as defined above, and $X^4$ is a divalent group having the formula (X4):

(X4)

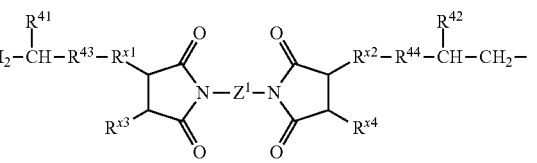

wherein $Z^1$ is a divalent organic group, $R^{41}$ and $R^{42}$ are each independently hydrogen or a $C_1$-$C_8$ monovalent hydrocarbon group in which some or all hydrogen may be substituted by halogen, $R^{43}$ and $R^{44}$ are each independently a $C_1$-$C_8$ alkanediyl group, $R^{x1}$ and $R^{x2}$ are each independently a single bond or a group to cyclize with $R^{x3}$ or $R^{x4}$ to form a ring structure, $R^{x3}$ and $R^{x4}$ are each independently hydrogen or a $C_1$-$C_8$ monovalent hydrocarbon group, or $R^{x3}$ or $R^{x4}$ is a single bond or a $C_1$-$C_{10}$ divalent hydrocarbon group when $R^{x3}$ or $R^{x4}$ cyclizes with $R^{x1}$ or $R^{x2}$ to form a ring structure.

In a preferred embodiment, the silicone resin further comprises recurring units having the formula (a5) and recurring units having the formula (b5).

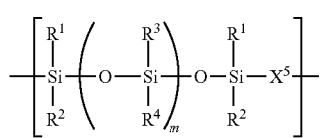

(a5)

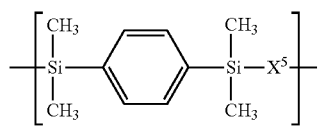

(b5)

Herein $R^1$ to $R^4$ and m are as defined above, and $X^5$ is a divalent group having the formula (X5):

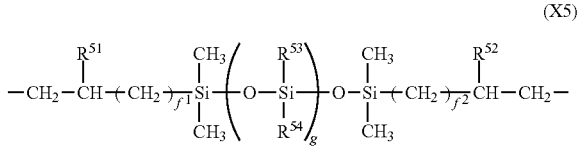

(X5)

wherein $R^{51}$ and $R^{52}$ are each independently hydrogen or methyl, $R^{53}$ and $R^{54}$ are each independently a $C_1$-$C_8$ monovalent hydrocarbon group, $f^1$ and $f^2$ are each independently an integer of 0 to 7, and g is an integer of 0 to 600.

Preferably, the photosensitive resin composition contains 0.01 to 60% by weight of the carbon black (B).

The photosensitive resin composition may further comprise (D) a crosslinker. The crosslinker is typically selected from the group consisting of melamine, guanamine, glycoluril and urea compounds having on the average at least two methylol and/or alkoxymethyl groups in the molecule, amino condensates modified with formaldehyde or formaldehyde-alcohol, phenol compounds having on the average at least two methylol or alkoxymethyl groups in the molecule, and epoxy compounds having on the average at least two epoxy groups in the molecule.

The photosensitive resin composition may further comprise (E) a solvent and/or (F) a quencher.

In a second aspect, the invention provides a photosensitive resin coating obtained from the photosensitive resin composition defined above.

In a third aspect, the invention provides a photosensitive dry film comprising a support and the photosensitive resin coating thereon.

In a fourth aspect, the invention provides a pattern forming process comprising the steps of:

(i) coating the photosensitive resin composition defined above onto a substrate to form a photosensitive resin coating thereon, (ii) exposing the photosensitive resin coating to radiation to define exposed and unexposed regions, and (iii) developing the exposed resin coating in a developer to dissolve away the unexposed region of the resin coating and to form a pattern of the resin coating.

In a fifth aspect, the invention provides a pattern forming process comprising the steps of:

(i') using the photosensitive dry film defined above to form the photosensitive resin coating on a substrate, (ii) exposing the photosensitive resin coating to radiation to define exposed and unexposed regions, (iii) developing the exposed resin coating in a developer to dissolve away the unexposed region of the resin coating and to form a pattern of the resin coating, and optionally, (iv) post-curing the patterned resin coating at a temperature of 100 to 250° C.

Also contemplated herein is a black matrix comprising the photosensitive resin coating defined above.

Advantageous Effects of Invention

The photosensitive resin composition forms a photosensitive resin coating which is black enough to have satisfactory light-shielding properties, and is improved in adhesion to substrates, reliability, developability, and resolution. The photosensitive resin coating of the photosensitive resin composition is useful in forming black matrixes.

DESCRIPTION OF PREFERRED EMBODIMENT

As used herein, the notation (Cn-Cm) means a group containing from n to m carbon atoms per group. "Optional" or "optionally" means that the subsequently described event or circumstances may or may not occur, and that description includes instances where the event or circumstance occurs and instances where it does not.

Photosensitive Resin Composition

One embodiment of the invention is a photosensitive resin composition comprising (A) a base resin comprising an acid crosslinkable group-containing silicone resin, (B) carbon black, and (C) a photoacid generator.

(A) Base Resin

Component (A) is a base resin comprising an acid crosslinkable group-containing silicone resin. As used herein, the term "acid crosslinkable group" refers functional groups that form a chemical bond directly or via a crosslinker under the action of an acid. Preferably the acid crosslinkable group is a phenolic hydroxyl group or epoxy group, with the phenolic hydroxyl group being most preferred.

One preferred base resin is a silicone resin (designated silicone resin A1, hereinafter) comprising essentially recurring units having the formula (a1) and recurring units having the formula (b1) (not containing recurring units (a2) and (b2) to be described later). For simplicity sake, the recurring units having formulae (a1) and (b1) are sometimes referred to as recurring units (a1) and (b1), respectively.

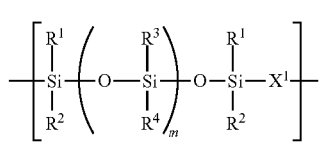

(a1)

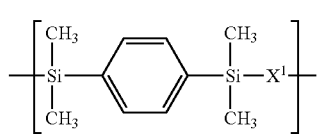

(b1)

In formula (a1), $R^1$ to $R^4$ are each independently a $C_1$-$C_8$, preferably $C_1$-$C_6$ monovalent hydrocarbon group. Suitable monovalent hydrocarbon groups include straight, branched or cyclic alkyl groups and aryl groups, for example, methyl, ethyl, propyl, hexyl, structural isomers thereof, cyclohexyl, and phenyl. Of these, methyl and phenyl are preferred because of availability of reactants.

In formula (a1), m is an integer of 0 to 600, preferably 0 to 400, more preferably 0 to 200.

In formulae (a1) and (b1), $X^1$ is a divalent group having the formula (X1).

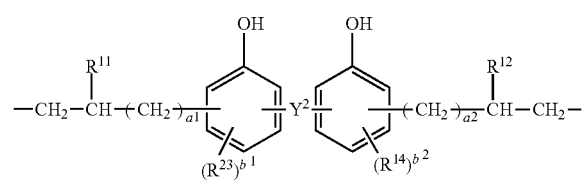

(X1)

In formula (X1), $Y^1$ is a single bond, methylene, propane-2,2-diyl, 1,1,1,3,3,3-hexafluoropropane-2,2-diyl or fluorene-9,9-diyl group. $R^{11}$ and $R^{12}$ are each independently hydrogen or methyl. $R^{13}$ and $R^{14}$ are each independently a $C_1$-$C_4$ alkyl group or $C_1$-$C_4$ alkoxy group, $a^1$ and $a^2$ are each independently an integer of 0 to 7, preferably 1 to 5, more preferably 1 to 3; $b^1$ and $b^2$ are each independently an integer of 0 to 2, preferably 0 or 1, most preferably 0.

The alkyl group may be straight, branched or cyclic, and examples thereof include methyl ethyl, propyl, butyl, and structural isomers thereof. The alkoxy group may be straight, branched or cyclic, and examples thereof include methoxy, ethoxy, propoxy, butoxy, and structural isomers thereof.

Another preferred base resin is a silicone resin (designated silicone resin A2, hereinafter) comprising essentially recurring units having the formula (a2) and recurring units having the formula (b2) (not containing recurring units (a1) and (b1)). For simplicity sake, the recurring units having formulae (a2) and (b2) are sometimes referred to as recurring units (a2) and (b2), respectively.

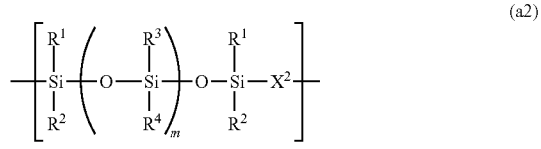

(a2)

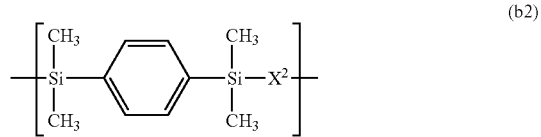

(b2)

In formulae (a2) and (b2), $R^1$ to $R^4$ and m are as defined above. $X^2$ is a divalent group having the formula (X2).

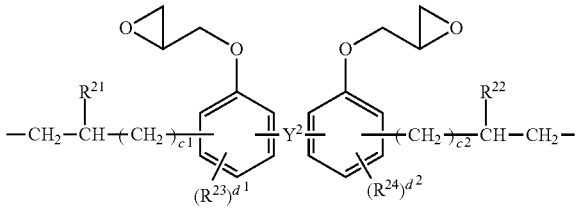

(X2)

In formula (X2), $Y^2$ is a single bond, methylene, propane-2,2-diyl, 1,1,1,3,3,3-hexafluoropropane-2,2-diyl or fluorene-9,9-diyl group. $R^{21}$ and $R^{22}$ are each independently hydrogen or methyl. $R^{23}$ and $R^{24}$ are each independently a $C_1$-$C_4$ alkyl group or $C_1$-$C_4$ alkoxy group; $c^1$ and $c^2$ are each independently an integer of 0 to 7, preferably 1 to 5, more preferably 1 to 3; $d^1$ and $d^2$ are each independently an integer of 0 to 2, preferably 0 or 1, most preferably 0. The alkyl and alkoxy groups are as exemplified above.

A further preferred base resin is a silicone resin (designated silicone resin A3, hereinafter) comprising essentially recurring units (a1) and (b1) and recurring units (a2) and (b2).

Each of silicone resins A1, A2, and A3 may further comprise recurring units having the formula (a3) and recurring units having the formula (3). For simplicity sake, the recurring units having formulae (a3) and (b3) are sometimes referred to as recurring units (a3) and (b3), respectively.

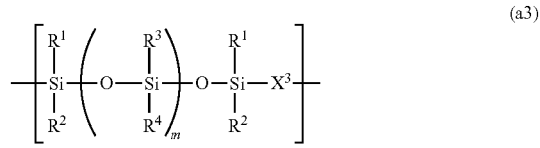

(a3)

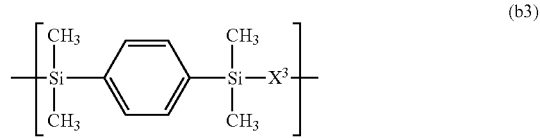

(b3)

In formulae (a3) and (b3), $R^1$ to $R^4$ and m are as defined above. $X^3$ is a divalent group having the formula (X3).

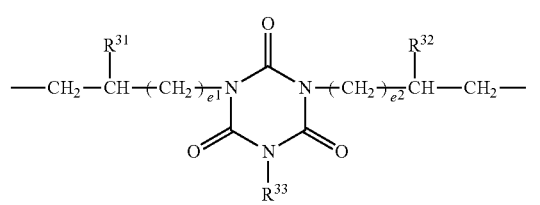

(X3)

In formula (X3), $R^{31}$ and $R^{32}$ are each independently hydrogen or methyl, $e^1$ and $e^2$ are each independently an integer of 0 to 7, preferably 1 to 5, and more preferably 1 to 3.

$R^{33}$ is a $C_1$-$C_8$ monovalent hydrocarbon group which may contain an ester bond or ether bond, or a monovalent group having the formula (X3-1).

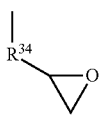
(X3-1)

The monovalent hydrocarbon group may be straight, branched or cyclic, and examples thereof include alkyl groups such as methyl, ethyl, n-propyl, and aryl groups such as phenyl. Of these, methyl or phenyl is preferred, with methyl being most preferred. An ester bond or ether bond may intervene between carbon atoms in the monovalent hydrocarbon group.

In formula (X3-1), $R^{34}$ is a $C_1$-$C_8$ divalent hydrocarbon group which may contain an ester bond or ether bond. The divalent hydrocarbon group may be straight, branched or cyclic, and examples thereof include $C_1$-$C_8$ alkanediyl groups such as methylene, ethylene, propane-1,2-diyl, propane-1,3-diyl, propane-2,2-diyl, butane-1,2-diyl, butane-1,3-diyl, and butane-1,4-diyl. Of these, methylene or ethylene is preferred, with methylene being most preferred. An ester bond or ether bond may intervene between carbon atoms in the divalent hydrocarbon group.

$R^{33}$ is preferably methyl, phenyl or glycidyl, with methyl or glycidyl being more preferred.

Each of silicone resins A1, A2, and A3 may further comprise recurring units having the formula (a4) and recurring units having the formula (b4). For simplicity sake, the recurring units having formulae (a4) and (b4) are sometimes referred to as recurring units (a4) and (b4), respectively.

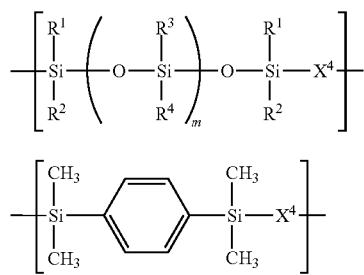

(a4)

(b4)

In formulae (a4) and (b4), $R^1$ to $R^4$ and m are as defined above. $X^4$ is a divalent group having the formula (X4).

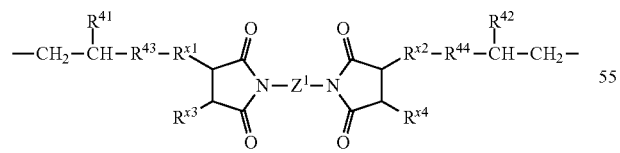

(6)

In formula (X4), $Z^1$ is a divalent organic group. Preferred examples of group $Z^1$ are shown below.

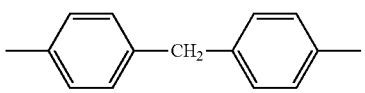

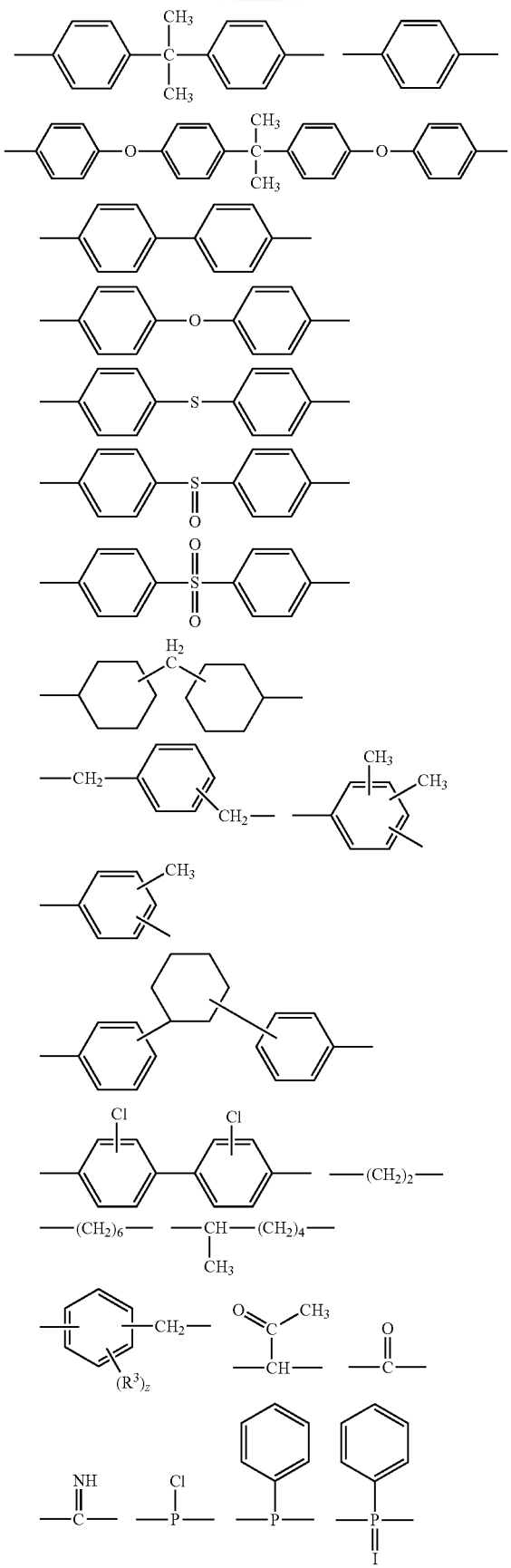

-continued

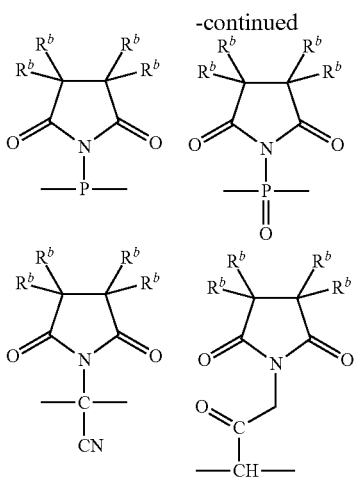

Herein $R^a$ is methyl, z is 0 or 1, and $R^b$ is each independently hydrogen or methyl.

Of the groups represented by $Z^1$, the following groups are more preferred

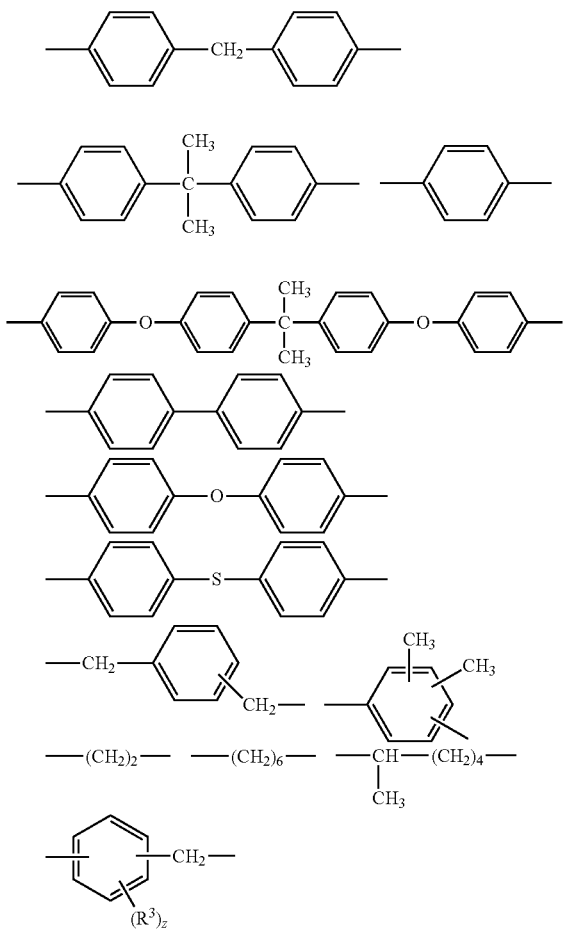

Herein $R^a$ and z are as defined above.

In the divalent organic group represented by $Z^1$, some or all hydrogen may be substituted by halogen. Exemplary halogen atoms include fluorine, chlorine, bromine and iodine.

In formula (X4), $R^{41}$ and $R^{42}$ are each independently hydrogen or a $C_1$-$C_8$ monovalent hydrocarbon group in which some or all hydrogen may be substituted by halogen. Examples of the monovalent hydrocarbon group include those exemplified above for $R^1$ to $R^4$, and substituted forms thereof in which some or all hydrogen is substituted by halogen.

In formula (X4), $R^{43}$ and $R^{44}$ are each independently a $C_1$-$C_8$ alkanediyl group. Examples thereof include methylene, ethylene, propane-1,2-diyl, propane-1,3-diyl, propane-2,2-diyl, butane-1,2-diyl, butane-1,3-diyl, and butane-1,4-diyl. Of these, methylene is preferred.

In formula (X4), $R^{x1}$ and $R^{x2}$ are each independently a single bond or a group which cyclizes with $R^{x3}$ or $R^{x4}$ to form a ring structure. $R^{x3}$ and $R^{x4}$ are each independently hydrogen or a $C_1$-$C_8$ monovalent hydrocarbon group, or $R^{x3}$ or $R^{x4}$ is a single bond or a $C_1$-$C_{10}$ divalent hydrocarbon group when $R^{x3}$ or $R^{x4}$ cyclizes with $R^{x1}$ or $R^{x2}$ to form a ring structure.

Examples of the ring structure formed by cyclization of $R^{x1}$ with $R^{x3}$ or $R^{x2}$ with $R^{x4}$ are shown below, but not limited thereto. It is noted that in the formula shown below, two valence bonds on the left side bond with the nitrogen-containing 5-membered ring in formula (X4) to form a ring structure.

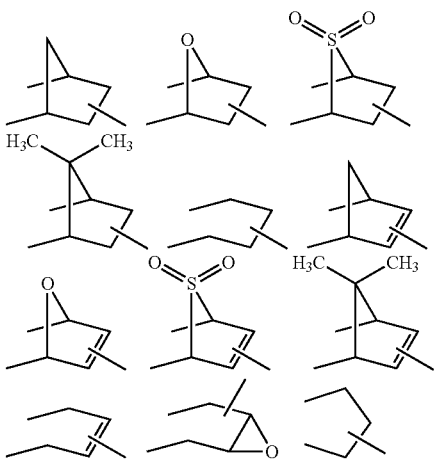

Of these, the ring structures of the formulae shown below are preferred.

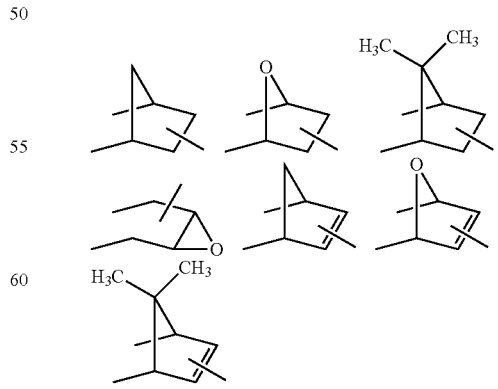

Of the divalent groups having formula (X4), groups having the formula (X4-1) are preferred.

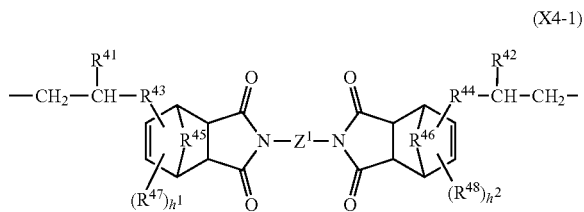

(X4-1)

In formula (X4-1), $Z^1$ and $R^{41}$ to $R^{44}$ are as defined above. $R^{45}$ and $R^{46}$ are each independently a $C_1$-$C_8$ alkanediyl group, examples of which include methylene, ethylene, propane-1,2-diyl, propane-1,3-diyl, propane-2,2-diyl, butane-1,2-diyl, butane-1,3-diyl, and butane-1,4-diyl. Of these, methylene is preferred.

In formula (X4-1), $R^{47}$ and $R^{48}$ are each independently a $C_1$-$C_8$ monovalent hydrocarbon group in which some or all hydrogen may be substituted by halogen. Examples of the monovalent hydrocarbon group include those exemplified above for $R^1$ to $R^4$, and substituted forms thereof in which some or all hydrogen is substituted by halogen. The subscripts $h^1$ and $h^2$ are each independently 0 or 1.

Each of silicone resins A1, A2, and A3 may further comprise recurring units having the formula (a5) and recurring units having the formula (b5). For simplicity sake, the recurring units having formulae (a5) and (b5) are sometimes referred to as recurring units (a5) and (b5), respectively.

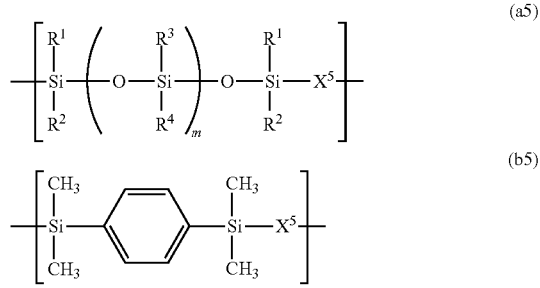

In formulae (a5) and (b5), $R^1$ to $R^4$ and m are as defined above. $X^5$ is a divalent group having the formula (X5).

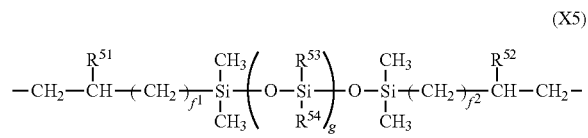

(X5)

In formula (X5), $R^{51}$ and $R^{52}$ are each independently hydrogen or methyl. $R^{53}$ and $R^{54}$ are each independently a $C_1$-$C_8$ monovalent hydrocarbon group, $f^1$ and $f^2$ are each independently an integer of 0 to 7, preferably 1 to 5, more preferably 1 to 3, and g is an integer of 0 to 600, preferably 0 to 400, more preferably 0 to 200. Examples of the monovalent hydrocarbon group include those exemplified above for $R^1$ to $R^4$.

Silicone resin A1, A2 or A3 has a film-forming ability. Notably, silicone resin A1, A2 or A3 contains a crosslinking group such as epoxy or hydroxyl group or a reactive site for crosslinking reaction in the molecule.

The recurring units may be bonded randomly or blockwise. Also, siloxane units in each recurring unit may be bonded randomly, or there may be included blocks each consisting of siloxane units of the same type. The silicone resin preferably has a silicone (siloxane units) content of 30 to 80% by weight.

In silicone resin A1, the fractions of recurring units (a1), (a3), (a4), (a5), (b1), (b3), (b4), and (b5) preferably meet the range: 0<a1<1.0, 0≤a3<1.0, 0≤a4<1.0, 0≤a5<1.0, 0<b1<1.0, 0≤b3<1.0, 0≤b4<1.0, 0≤b5<1.0, and 0<a1+b1≤1.0; more preferably, additionally meet the range: 0≤a3+b3<1.0, 0≤a4+b4≤0.8, 0≤a5+b5≤0.6, 0.1≤a1+a3+a4+a5≤0.7, and 0.3≤b1+b3+b4+b5≤0.9, with the proviso a1+a3+a4+a5+b1+b3+b4+b5=1.

In silicone resin A2, the fractions of recurring units (a2), (a3), (a4), (a5), (b2), (b3), (b4), and (b5) preferably meet the range: 0<a2<1.0, 0≤a3<1.0, 0≤a4<1.0, 0≤a5<1.0, 0<b2<1.0, 0≤b3<1.0, 0≤b4<1.0, 0≤b5<1.0, and 0<a2+b2≤1.0; more preferably, additionally meet the range: 0≤a3+b3<1.0, 0≤a4+b4≤0.8, 0≤a5+b5≤0.6, 0.1≤a2+a3+a4+a5≤0.7, and 0.3≤b2+b3+b4+b5≤0.9, with the proviso a2+a3+a4+a5+b2+b3+b4+b5=1.

In silicone resin A3, the fractions of recurring units (a1), (a2), (a3), (a4), (a5), (b1), (b2), (b3), (b4), and (b5) preferably meet the range: 0<a1<1.0, 0<a2<1.0, 0≤a3<1.0, 0≤a4<1.0, 0≤a5<1.0, 0<b1<1.0, 0<b2<1.0, 0≤b3<1.0, 0≤b4<1.0, 0≤b5<1.0, and 0<a1+b1+a2+b2≤1.0; more preferably, additionally meet the range: 0≤a3+b3<1.0, 0≤a4+b4≤0.8, 0≤a5+b5≤0.6, 0.1≤a1+a2+a3+a4+a5≤0.7, and 0.3≤b1+b2+b3+b4+b5≤0.9, with the proviso a1+a2+a3+a4+a5+b1+b2+b3+b4+b5=1.

Each of the silicone resins A1, A2 and A3 preferably has a weight average molecular weight (Mw) of 3,000 to 500,000, more preferably 5,000 to 200,000. It is noted throughout the disclosure that Mw is measured by gel permeation chromatography (GPC) versus polystyrene standards using tetrahydrofuran as the elute.

The silicone resin A1 may be prepared by combining a compound of formula (1), a compound of formula (2), a compound of formula (3), and optionally at least one compound selected from a compound of formula (5), a compound of formula (6), and a compound of formula (7), and effecting addition polymerization in the presence of a metal catalyst. All formulae are shown below.

The silicone resin A2 may be prepared by combining a compound of formula (1), a compound of formula (2), a compound of formula (4), and optionally at least one compound selected from a compound of formula (5), a compound of formula (6), and a compound of formula (7), and effecting addition polymerization in the presence of a metal catalyst.

The silicone resin A3 may be prepared by combining a compound of formula (1), a compound of formula (2), a compound of formula (3), a compound of formula (4), and optionally at least one compound selected from a compound of formula (5), a compound of formula (6), and a compound of formula (7), and effecting addition polymerization in the presence of a metal catalyst.

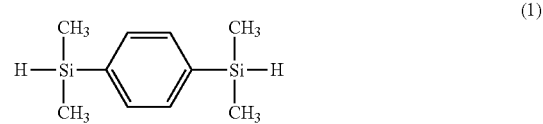

(1)

-continued

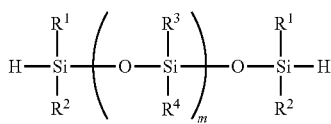
(2)

Herein R¹ to R⁴ and m are as defined above.

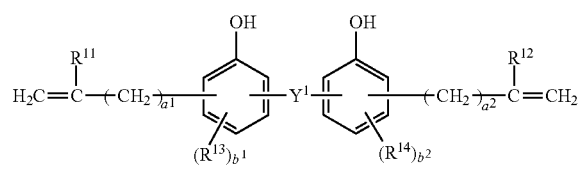
(3)

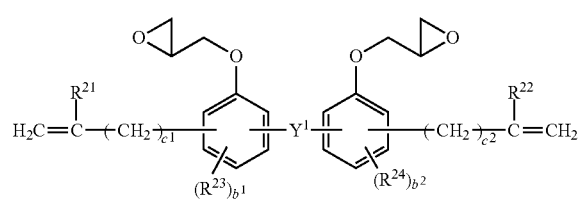
(4)

Herein R¹¹ to R¹⁴, R²¹ to R²⁴, Y¹, Y², a¹, a², b¹, b², c¹, c², d¹ and d² are as defined above.

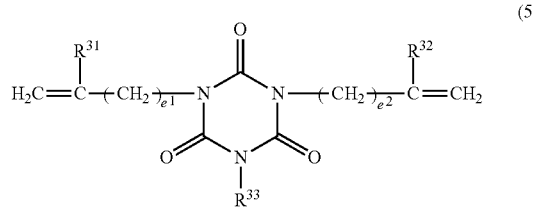
(5)

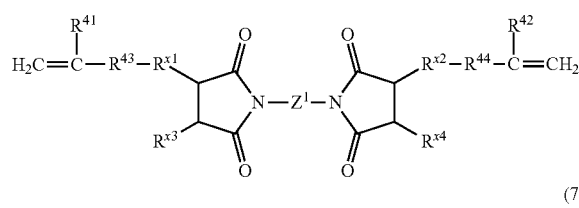
(6)

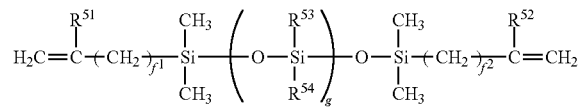
(7)

Herein R³¹ to R³³, R⁴¹ to R⁴⁴, R⁵¹ to R⁵⁴, R$^{x1}$, R$^{x2}$, R$^{x3}$, R$^{x4}$, Z¹, e¹, e², f¹, f², and g are as defined above.

Examples of the metal catalyst used herein include platinum group metals alone such as platinum (including platinum black), rhodium and palladium; platinum chlorides, chloroplatinic acids and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon; rhodium-olefin complexes; chlorotis(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight, more preferably 0.01 to 0.1% by weight of platinum group metal based on the total weight of the compounds (exclusive of the solvent) used in the addition polymerization.

In the addition polymerization, a solvent may be used, if desired. Suitable solvents are hydrocarbon solvents such as toluene and xylene. The reaction temperature is preferably in a range of 40 to 150° C., more preferably 60 to 120° C., within which the catalyst is not deactivated and the polymerization can be completed within a short time. The polymerization time varies with the type and amount of the resulting resin. It is preferably about 0.5 to about 100 hours, more preferably about 0.5 to about 30 hours for preventing moisture entry into the polymerization system. After the completion of reaction, the solvent (if used) is distilled off whereupon the silicone resin A is obtained.

The reaction procedure is not particularly limited. In one example of reacting the compound of formula (1), the compound of formula (2), the compound of formula (3) and/or the compound of formula (4), with at least one compound selected from the compound of formula (5), the compound of formula (6), and the compound of formula (7), the preferred procedure is by first mixing the compound of formula (3) and/or (4) with at least one compound selected from the compound of formula (5), the compound of formula (6), and the compound of formula (7), heating the mixture, adding a metal catalyst to the mixture, and then adding the compound of formula (1) and the compound of formula (2) dropwise over 0.1 to 5 hours.

The reactants are preferably combined in such amounts that a molar ratio of the total amount of hydrosilyl groups in the compounds of formulae (1) and (2) to the total amount of alkenyl groups in the compound of formula (3) and/or (4) and at least one compound selected from the compound of formula (5), the compound of formula (6), and the compound of formula (7), may range from 0.67 to 1.67, more preferably from 0.83 to 1.25.

With respect to the amounts of these compounds used, the compound of formula (1) and the compound of formula (2) are preferably combined such amounts that the molar ratio of (1):(2) may range from 5:95 to 20:80, more preferably from 10:90 to 70:30.

Provided that N3, N4, N5, N6, and N7 represent the amounts or molar fractions of compounds of formulae (3), (4), (5), (6), and (7), respectively, they preferably meet the range: $0 \leq N3/X \leq 1.0$, $0 \leq N4/X < 1.0$, $0 < (N3+N4)/X \leq 1.0$, $0 \leq N5/X < 1.0$, $0 \leq N6/X \leq 0.8$, $0 \leq N7/X \leq 0.6$. Notably, $X = N3+N4+N5+N6+N7$.

The Mw of the resulting resin can be controlled using a molecular weight control agent such as a monoallyl compound (e.g., o-allylphenol), monohydrosilane (e.g., triethylhydrosilane) or monohydrosiloxane.

The compounds of formulae (1) to (7) are commercially available, or may be synthesized by conventional well-known methods.

As the base resin (A), silicone resins A1, A2 and A3 may be used alone or in any combination. The base resin (A) may contain another silicone resin in addition to silicone resins A1, A2 and/or A3. The other silicone resin may be at least one member selected from a silicone resin comprising recurring units (a3) and recurring units (b3), designated silicone resin B, a silicone resin comprising recurring units (a4) and recurring units (b4), designated silicone resin C, and a silicone resin comprising recurring units (a5) and recurring units (b5), designated silicone resin D.

In the embodiment wherein the base resin (A) contains silicone resins B to D, the silicone resins A1 to A3 should preferably be free of recurring units (a3) to (a5) and (b3) to (b5).

In silicone resin B, the fractions of recurring units (a3) and (b3) are in the range: 0<a3<1.0, 0<b3<1.0, and a3+b3=1.0, preferably 0.1≤a3≤0.7, 0.3≤b3≤0.9, and a3+b3=1.0. In silicone resin C, the fractions of recurring units (a4) and (b4) are in the range: 0<a4<1.0, 0<b4<1.0, and a4+b4=1.0, preferably 0.1≤a4≤0.7, 0.3≤b4≤0.9, and a4+b4=1.0. In silicone resin D, the fractions of recurring units (a5) and (b5) are in the range: 0<a5<1.0, 0<b5<1.0, and a5+b5=1.0, preferably 0.1≤a5≤0.7, 0.3≤b5≤0.9, and a5+b5=1.0.

When the base resin as component (A) contains silicone resins B, C and D, the content of each resin is more than 0 to 100 parts by weight per 100 parts by weight of silicone resins A1, A2 and A3 combined.

(B) Carbon Black

Component (B) is carbon black, preferably having an average primary particle size of 10 to 100 nm. As used herein, the average primary particle size is an arithmetic average particle size of carbon black particles observed under an electron microscope.

Many carbon black products are commercially available. Examples include HS-100 from Denka Co. Ltd.; Mitsubishi-S, Carbon Black #2650, #2600, #2350, #2300, #1000, #980, #970, #960, #950, #900, #850, MCF88, MA600, #750B, #650B, #52, #47, #45, #45L, #44, #40, #33, #32, #30, #25, #20, #10, #5, #95, #85, #240, MA77, MA7, MA8, MA11, MA100, MA100R, MA100S, MA230, MA220, MA14, #4000B, #3030B, #3050B, #3230B, #3400B, Diablack® A, Diablack N220M, Diablack N234, Diablack I, Diablack LI, Diablack II, Diablack 339, Diablack SH, Diablack SHA, Diablack LH, Diablack H, Diablack HA, Diablack SF, Diablack N550M, Diablack E, Diablack G, Diablack R, Diablack N760M, and Diablack LR from Mitsubishi Chemical Corp.; Thermax® N990, N991, N907, N908, N990, N991, N908 from Cancarb, Ltd.; Asahi #80, Asahi #70, Asahi #70L, Asahi F-200, Asahi #66, Asahi #66HN, Asahi #60H, Asahi #60U, Asahi #60, Asahi #55, Asahi #50H, Asahi #51, Asahi #50U, Asahi #50, Asahi #35, Asahi #15, and Asahi Thermal from Asahi Carbon Co., Ltd., Colour Black Fw18, Colour Black Fw2, Colour Black Fw2V, Colour Black Fw1, Colour Black Fw18, Colour Black S170, Colour Black S160, Special Black 6, Special Black 5, Special Black 4, Special Black 4A, PRINTEX U, PRINTEX V, PRINTEX 140U, PRINTEX 140V from Orion Engineered Carbons; SF Black AD2065, SF Black AD2091, SF Black AD2128, SF Black AD4179 from Sanyo Color Works, Ltd.

Component (B) is preferably present in an amount of 0.01 to 60% by weight, more preferably 10 to 40% by weight based on the photosensitive resin composition. As long as the amount of component (B) is equal to or more than the lower limit, the resin composition forms a film having a sufficient light-shielding effect, but not peeling and breakage properties. As long as the amount of component (B) is equal to or less than the upper limit, the resin composition is smoothly flowable and effectively loadable so that it has a good film forming ability, reliability, adhesion, and resolution.

(C) Photoacid Generator

The photoacid generator (PAG) as component (C) is typically a compound which is decomposed to generate an acid upon light exposure, preferably upon exposure to light with a wavelength of 190 to 500 nm. The generated acid serves as a curing catalyst. Typical PAGs include onium salts, diazomethane derivatives, glyoxime derivatives, β-ketosulfone derivatives, disulfone derivatives, nitrobenzyl sulfonate derivatives, sulfonic acid ester derivatives, imidoyl sulfonate derivatives, oxime sulfonate derivatives, imino sulfonate derivatives, and triazine derivatives.

Suitable onium salts include sulfonium salts having the formula (C1) and iodonium salts having the formula (C2).

In formulae (C1) and (C2), $R^{101}$ to $R^{105}$ are each independently an optionally substituted $C_1$-$C_{12}$ alkyl group, optionally substituted $C_6$-$C_{12}$ aryl group, or optionally substituted $C_7$-$C_{12}$ aralkyl group. A is a non-nucleophilic counter ion.

The alkyl group may be straight, branched or cyclic, and examples thereof include methyl, ethyl, n-propyl, isopropyl, cyclopropyl, n-butyl, isobutyl, sec-butyl, tert-butyl, cyclobutyl, n-pentyl, cyclopentyl, cyclohexyl norbornyl, and adamantyl. Suitable aryl groups include phenyl, naphthyl, and biphenylyl. Suitable aralkyl groups include benzyl and phenethyl.

Suitable substituents include oxo, $C_1$-$C_{12}$ straight, branched or cyclic alkoxy moieties, $C_1$-$C_{12}$ straight, branched or cyclic alkyl moieties, $C_6$-$C_{24}$ aryl moieties, $C_7$-$C_{25}$ aralkyl moieties, $C_6$-$C_{24}$ aryloxy moieties, and $C_6$-$C_{24}$ arylthio moieties.

Preferably, $R^{101}$ to $R^{105}$ are optionally substituted alkyl groups such as methyl, ethyl, propyl, butyl, cyclohexyl, norbornyl, adamantyl, and 2-oxocyclohexyl; optionally substituted aryl groups such as phenyl, naphthyl, biphenylyl, o-, m- or p-methoxyphenyl, ethoxyphenyl, m- or p-tert-butoxyphenyl, 2-, 3- or 4-methylphenyl, ethylphenyl, 4-tert-butylphenyl, 4-butylphenyl, dimethylphenyl, terphenylyl, biphenylyoxyphenyl, and biphenylylthiophenyl; and optionally substituted aralkyl groups such as benzyl and phenethyl. Of these, optionally substituted aryl groups and optionally substituted aralkyl groups are more preferred.

Examples of the non-nucleophilic counter ion include halide ions such as chloride and bromide ions; fluoroalkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; fluoroalkanesulfonimide ions such as trifluoromethanesulfonimide; fluoroalkanesulfonylmethide ions such as tris(trifluoromethanesulfonyl)methide; and borate ions such as tetrakisphenylborate and tetrakis(pentafluorophenyl)borate.

Suitable diazomethane derivatives include compounds having the formula (C3).

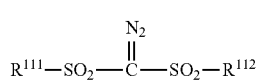
(C3)

In formula (C3), $R^{111}$ and $R^{112}$ are each independently a $C_1$-$C_{12}$ alkyl or haloalkyl group, optionally substituted $C_6$-$C_{12}$ aryl group, or $C_7$-$C_{12}$ aralkyl group.

The alkyl group may be straight, branched or cyclic, and examples thereof are as exemplified above in conjunction with $R^{101}$ to $R^{105}$. Suitable haloalkyl groups include trifluoromethyl, 1,1,1-trifluoroethyl, 1,1,1-trichloroethyl, and nonafluorobutyl.

Examples of the optionally substituted aryl group include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Suitable aralkyl groups include benzyl and phenethyl.

Suitable glyoxime derivatives include compounds having the formula (C4).

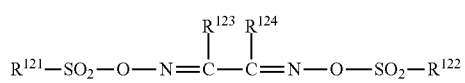
(C4)

In formula (C4), $R^{121}$ to $R^{124}$ are each independently a $C_1$-$C_{12}$ alkyl or haloalkyl group, optionally substituted $C_6$-$C_{12}$ aryl group, or $C_7$-$C_{12}$ aralkyl group. $R^{123}$ and $R^{124}$ may bond together to form a ring with the carbon atoms to which they are attached. In the case of ring formation, the combination of $R^{123}$ and $R^{124}$ is a straight or branched $C_1$-$C_{12}$ alkylene group.

Examples of the alkyl, haloalkyl, optionally substituted aryl, and aralkyl groups are as exemplified above in conjunction with $R^{111}$ to $R^{112}$. Suitable straight or branched alkylene groups include methylene, ethylene, propylene, butylene, and hexylene.

Examples of the onium salt include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)sulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl(4-thiophenoxyphenyl)sulfonium hexafluoroantimonate, [4-(4-biphenylylthio)phenyl]-4-biphenylylphenylsulfonium tris(trifluoromethanesulfonyl)-methide, triphenylsulfonium tetrakis(fluorophenyl)borate, tris(4-acetylphenyl)thiophenylsulfonium tetrakis(fluorophenyl)borate, triphenylsulfonium tetrakis(pentafluorophenyl)borate, and tris[4-(4-acetylphenyl)thiophenyl]sulfonium tetrakis (pentafluorophenyl)borate.

Examples of the diazomethane derivative include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, bis(tert-butylsulfonyl) diazomethane, bis(n-pentylsulfonyl)diazomethane, bis (isopentylsulfonyl)diazomethane, bis(sec-pentylsulfonyl) diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Examples of the glyoxime derivative include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoximne, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime bis-o(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Examples of the β-ketosulfone derivative include 2-cyclohexylcarbonyl-2-(p-toluenesulfonyl)propane and 2-isopropylcarbonyl-2-(p-toluenesulfonyl)propane.

Examples of the disulfone derivative include diphenyl disulfone and dicyclohexyl disulfone.

Examples of the nitrobenzyl sulfonate derivative include 2,6-dinitrobenzyl p-toluenesulfonate and 2,4-dinitrobenzyl p-toluenesulfonate.

Examples of the sulfonic acid ester derivative include 1,2,3-tris(methanesulfonyloxy)benzene, 1,2,3-tris(trifluoromethanesulfonyloxy)benzene, and 1,2,3-tris(p-toluenesulfonyloxy)benzene.

Examples of the imidyl sulfonate derivative include phthalimidyl triflate, phthalimidyl tosylate, 5-norbornene-2,3-dicarboximidyl triflate, 5-norbornene-2,3-dicarboximidyl tosylate, 5-norbornene-2,3-dicazboximidyl n-butylsulfonate, and n-trifluoromethylsulfonyloxynaphthylimide.

Typical of the oximesulfonate derivative is α-(benzenesulfonium oxyimino)-4-methylphenylacetonitrile.

Examples of the iminosulfonate derivative include (5-(4-methylphenyl)sulfonyloxyimino-5H-thiophen-2-ylidene)-(2-methylphenyl)-acetonitrile and (5-(4-(4-methylphenylsulfonyloxy)phenylsulfonyloxyimino-5H-thiophen-2-ylidene)-(2-methylphenyl)acetonitrile.

Also useful is 2-methyl-2-[(4-methylphenyl)sulfonyl]-1-[(4-methylthio)phenyl]-1-propane.

The preferred PAGs as component (C) are the onium salts, with the sulfonium salts being more preferred.

The PAG (C) is preferably used in an amount of 0.05 to 20 parts by weight, and more preferably 0.05 to 5 parts by weight per 100 parts by weight of component (A). An amount of the PAG in the range generates a sufficient amount of acid for crosslinking reaction to take place.

(D) Crosslinker

Preferably the photosensitive resin composition further comprises (D) a crosslinker. Since the crosslinker reacts with epoxy or hydroxyl groups in formulae (a1) to (a3) and (b1) to (b3) as component (A), it functions to facilitate pattern formation and to increase the strength of the cured composition.

Preferably, the crosslinker is selected from nitrogen-containing compounds such as melamine, guanamine, glycoluril and urea compounds, having on the average at least two methylol and/or alkoxymethyl groups in the molecule, amino condensates modified with formaldehyde or formaldehyde-alcohol, phenol compounds having on the average at least two methylol or alkoxymethyl groups in the molecule, and epoxy compounds having on the average at least two epoxy groups in the molecule. These compounds may be used alone or in admixture.

The melamine compound preferably has the formula (D1).

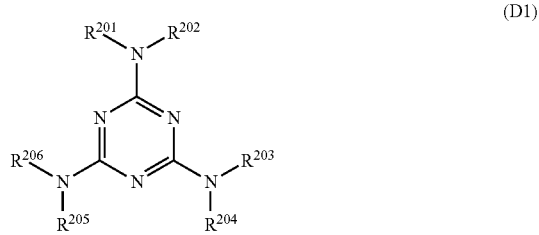

In formula (D1), $R^{201}$ to $R^{206}$ are each independently a methylol group, $C_2$-$C_5$ alkoxymethyl group, or hydrogen, at least one of $R^{201}$ to $R^{206}$ is methylol or alkoxymethyl. Suitable alkoxymethyl groups include methoxymethyl and ethoxymethyl.

Examples of the melamine compound having formula (D1) include trimethoxymethylmonomethylolmelamine, dimethoxymethylmonomethylolmelamine, trimethylolmelamine, hexamethylolmelamine, hexamethoxymethylmelamine, and hexaethoxymethylmelamine.

The melamine compound having formula (D1) may be prepared, for example, by modifying a melamine monomer with formaldehyde into a methylol form in a well-known manner, and optionally, further modifying it with an alcohol into an alkoxy form. The alcohols used herein are preferably lower alcohols, for example, alcohols having 1 to 4 carbon atoms.

Suitable guanamine compounds include tetramethylolguanamine, tetramethoxymethylguanamine and tetramethoxyethylguanamine. Suitable glycoluril compounds include tetramethylolglycoluril and tetramethoxymethylglycoluril. Suitable urea compounds include tetramethylolurea, tetramethoxymethylurea, tetramethoxyethylurea, tetraethoxymethylurea, and tetrapropoxymethylhlurea.

Examples of the amino condensate modified with formaldehyde or formaldehyde-alcohol include melamine condensates modified with formaldehyde or formaldehyde-alcohol, and urea condensates modified with formaldehyde or formaldehyde-alcohol.

The modified melamine condensates are obtained, for example, by effecting addition polycondensation of a modified melamine having formula (D1) or an oligomer (e.g., dimer or trimer) thereof with formaldehyde until a desired molecular weight is reached. The addition polycondensation may be performed by any prior art well-known methods. The modified melamine having formula (D1) may be used alone or in admixture.

Examples of the urea condensate modified with formaldehyde or formaldehyde-alcohol include methoxymethylated urea condensates, ethoxymethylated urea condensates, and propoxymethylated urea condensates.

The modified urea condensates are prepared, for example, by modifying a urea condensate having a desired molecular weight with formaldehyde into a methylol form in a well-known manner, and optionally, further modifying it with an alcohol into an alkoxy form.

Examples of the phenol compound having on the average at least two methylol or alkoxymethyl groups in the molecule include (2-hydroxy-5-methyl)-1,3-benzenedimethanol and 2,2',6,6'-tetramethoxymethylbisphenol A.

Examples of the epoxy compound having on the average at least two epoxy groups in the molecule include bisphenol epoxy resins such as bisphenol A epoxy resins and bisphenol F epoxy resins, novolak epoxy resins such as phenol novolak epoxy resins and cresol novolak epoxy resins, triphenol alkane epoxy resins, biphenyl epoxy resins, dicyclopentadiene-modified phenol novolak epoxy resins, phenol aralkyl epoxy resins, biphenyl aralkyl epoxy resins, naphthalene ring-containing epoxy resins, glycidyl ester epoxy resins, cycloaliphatic epoxy resins, and heterocyclic epoxy resins.

The crosslinker (D) may be added in an amount of 0 to 100 parts by weight per 100 parts by weight of component (A), and when used, preferably in an amount of 0.5 to 100 parts, more preferably 0.5 to 50 parts, and even more preferably 1 to 30 parts by weight per 100 parts by weight of component (A). At least 0.5 part of component (D) ensures sufficient cure upon light exposure. As long as the amount of component (D) is up to 100 parts, the proportion of component (A) in the resin composition is not reduced, allowing the cured composition to exert its effects to the full extent. The crosslinkers may be used alone or in admixture.

(E) Solvent

To the photosensitive resin composition, (E) a solvent may be added in order to facilitate the coating operation. The solvent (E) used herein is not particularly limited as long as the foregoing components and other additives are dissolvable or dispersible therein.

Preferred solvents are organic solvents because the components are effectively dissolvable. Illustrative, non-limiting, examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in combinations of two or more.

Of these solvents, preferred are ethyl lactate, cyclohexanone, cyclopentanone, PGMEA, γ-butyrolactone, and mixtures thereof, in which the PAG is most soluble.

The solvent (E) may be added in an amount of 0 to 5,000 parts by weight per 100 parts by weight of components (A), (B) and (C) combined. When the solvent is used, it is preferred from the standpoints of compatibility and viscosity of the resin composition that the solvent (E) be added in an amount of 50 to 2,000 parts, more preferably 50 to 1,000 parts, and especially 50 to 100 parts by weight per 100 parts by weight of components (A), (B) and (C) combined.

(F) Quencher

The photosensitive resin composition may further contain a quencher, typically in the form of a basic compound, as component (F). The quencher used herein is preferably a compound capable of suppressing the rate of diffusion when the acid generated by the PAG diffuses within the resin coating. The inclusion of the quencher improves resolution, suppresses changes in sensitivity following exposure and reduces substrate and environment dependence, as well as improving the exposure latitude and the pattern profile.

Examples of the quencher include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-penylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-ethylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Compounds of the formula (F1) are also useful as the quencher.

In formula (F1), v is 1, 2 or 3; $R^{301}$ is selected from substituent groups of the following formulas (F2) to (F4), $R^{302}$ is hydrogen or a $C_1$-$C_{20}$ alkyl group which may contain an ether bond or hydroxyl moiety. Where two or three $R^{301}$ are present, two $R^{301}$ may bond together to form a ring with the nitrogen atom to which they are attached. Where two or three $R^{301}$ are present, they may be the same or different. Where two $R^{302}$ are present, they may be the same or different.

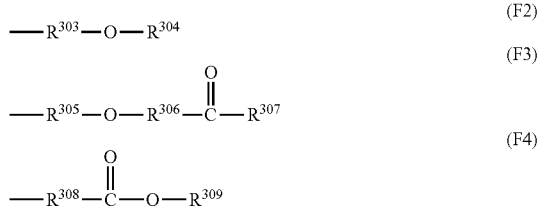

In formulae (F2) to (F4), $R^{303}$, $R^{305}$ and $R^{308}$ are each independently a straight or branched $C_1$-$C_4$ alkanediyl group. $R^{304}$ and $R^{307}$ are each independently hydrogen, a $C_1$-$C_{20}$ alkyl group which may contain at least one hydroxyl moiety, ether bond, ester bond or lactone ring. $R^{306}$ is a single bond or a straight or branched $C_1$-$C_4$ alkanediyl group. $R^{309}$ is a $C_1$-$C_{20}$ alkyl group which may contain at least one hydroxyl moiety, ether bond, ester bond or lactone ring.

Examples of the compound of formula (F1) include tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine N,N-bis(2-acetoxyethyl)-2-(tetrahydrofurfuryloxycarbonyl)ethylamine N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone.

Component (F) may be formulated in an amount of 0 to 3 parts by weight. When used, component (F) is preferably added from the standpoint of sensitivity in an amount of 0.01 to 2 parts by weight, and especially 0.05 to 1 part by weight, per 100 parts by weight of component (A).

Other Additives

Besides the aforementioned components, the photosensitive resin composition may contain other additives, for example, surfactants which are commonly used for improving coating properties, silane coupling agents, and fillers.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. When used, the amount of the surfactant is preferably 0.05 to 1 part by weight per 100 parts by weight of component (A).

Inclusion of a silane coupling agent is effective for enhancing the adhesion of the resin composition to adherends. Suitable silane coupling agents include epoxy silane coupling agents and aromatic aminosilane coupling agents. The silane coupling agent may be used alone or in admixture. The amount of the silane coupling agent used is not particularly limited as long as the benefits of the invention are not impaired. When used, the amount of the silane coupling agent is preferably 0.01 to 5% by weight of the resin composition.

A filler may also be blended in the resin composition as the other additive. The filler is typically silica or silicone powder having an average particle size of 0.01 to 20 µm. The amount of the filler is preferably up to 90% by weight of the resin composition, though not limited thereto.

The photosensitive resin composition as formulated above forms a coating or film which is devoid of cracks and has good film properties, and is thus best suited as a material for forming a black matrix requiring light-shielding properties.

Pattern Forming Process

Another embodiment of the invention is a pattern forming process using the photosensitive resin composition defined above, the process comprising the steps of:

(i) coating the photosensitive resin composition onto a substrate to form a photosensitive resin coating thereon, (ii) exposing the photosensitive resin coating to radiation to define exposed and unexposed regions, and (iii) developing the exposed resin coating in a developer to dissolve away the unexposed region of the resin coating and to form a pattern of the resin coating.

First, in step (i), the photosensitive resin composition is coated onto a substrate to form a photosensitive resin coating thereon. Examples of the substrate include silicon wafers, glass wafers, quartz wafers, plastic circuit boards, and ceramic circuit boards.

The coating technique may be any well-known technique, for example, dipping, spin coating, roll coating or the like. The coating weight may be selected as appropriate for a particular purpose, preferably so as to form a photosensitive resin coating having a thickness of 0.1 to 200 µm, more preferably 1 to 150 µm.

A pre-wetting technique of dispensing a solvent dropwise on a substrate prior to coating of the resin composition may be employed for the purpose of making the coating thickness on the substrate more uniform. The type and amount of the solvent dispensed dropwise may be selected for a particular purpose. For example, alcohols such as isopropyl alcohol (IPA), ketones such as cyclohexanone, and glycols such as propylene glycol monomethyl ether are preferred. The solvent used in the photosensitive resin composition may also be used.

At this point, the coating may be prebaked to volatilize off the solvent and the like, if necessary, for efficient photo-cure reaction. Prebake may be performed, for example, at 40 to 140° C. for 1 minute to about 1 hour.

Next, in step (ii), the photosensitive resin coating is exposed to radiation to define exposed and unexposed regions. The exposure radiation is preferably of wavelength 10 to 600 nm, more preferably 190 to 500 nm. Examples of radiation in the wavelength range include radiation of various wavelengths from radiation-emitting units, specifically UV radiation such as g-line, h-line or i-line, and deep UV (248 nm, 193 nm). Among these, radiation of wavelength 248 to 436 am is preferred. An appropriate exposure dose is 10 to 10,000 mJ/cm$^2$.

Exposure may be made through a photomask. The photomask may be, for example, one perforated with a desired pattern. Although the material of the photomask is not particularly limited, a material capable of shielding radiation in the above wavelength range, typically chromium is preferred.

The next step may be post-exposure bake (PEB) which is effective for enhancing development sensitivity. PEB is preferably performed at 40 to 150° C. for 0.5 to 10 minutes. The exposed region of the resin coating is crosslinked during PEB to form an insolubilized pattern which is insoluble in an organic solvent as developer.

The exposure or PEB is followed by the step (iii) of developing the exposed resin coating in a developer to dissolve away the unexposed region of the resin coating and to form a pattern of the resin coating. The preferred developers are organic solvents including alcohols such as IPA, ketones such as cyclohexanone, and glycols such as propylene glycol monomethyl ether. The solvent used in the photosensitive resin composition is also useful. Development is effected in a conventional manner, for example, by dipping the exposed coating in the developer. The development is followed by washing, rinsing and drying if necessary. In this way, a resin coating having the desired pattern is obtained.

In step (iv), the patterned coating may be post-cured in an oven or hot plate at a temperature of preferably 100 to 250° C., more preferably 150 to 220° C. The photosensitive resin composition ensures that a resin coating having improved film properties is obtained from post-cure even at a relatively low temperature around 200° C. The post-cure is effective for increasing the crosslinking density of the resin coating and removing any residual volatile matter. The resulting coating has augmented adhesion to substrates, heat resistance, mechanical strength, good electric properties, and bond strength. A post-cure temperature in the range of 100 to 250° C. is preferred for acquiring the above properties. The post-cure time is preferably 10 minutes to 10 hours, more preferably 10 minutes to 3 hours. The resin coating as post-cured has a thickness of 1 to 200 µm, preferably 5 to 50 µm. Through the foregoing steps, a cured film suited for the final black matrix application is obtained.

Photosensitive Dry Film

A further embodiment of the invention is a photosensitive dry film comprising a support and a photosensitive resin coating of the photosensitive resin composition thereon.

The photosensitive dry film (support+photosensitive resin coating) is solid, and the photosensitive resin coating contains no solvent. This eliminates the risk that bubbles resulting from volatilization of solvent are left within the resin coating and between the resin coating and the rugged substrate surface. The photosensitive resin coating preferably has a thickness of 1 to 200 µm, more preferably 3 to 100 µm.

Furthermore, the viscosity and fluidity of the photosensitive resin coating are closely correlated. As long as the photosensitive resin coating has a proper range of viscosity, it exhibits a sufficient fluidity to fill deeply even in a narrow gap or it softens to enhance the adhesion to the substrate. Accordingly, from the standpoint of fluidity, the photosensitive resin coating should preferably have a viscosity in the range of 10 to 5,000 Pa·s, more preferably 30 to 2,000 Pa·s, and even more preferably 50 to 300 Pa·s at a temperature of 80 to 120° C. It is noted that the viscosity is measured by a rotational viscometer.

The photosensitive dry film has the advantage that when tightly attached to a substrate having asperities on its surface, the photosensitive resin coating is coated so as to conform to the asperities, achieving high planarity. Since the photosensitive resin composition is characterized by softening performance, high planarity is positively achievable. Further, if the photosensitive resin coating is in close contact with the substrate in a vacuum environment, generation of gaps therebetween is effectively inhibited.

The photosensitive dry film may be manufactured by coating the photosensitive resin composition to a support and drying the resin composition into a resin coating. An apparatus for manufacturing the photosensitive dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support (film) is unwound from a supply roll in the film coater, passed across the head of the film coater where the photosensitive resin composition is coated onto the support to the predetermined buildup, and then moved through a hot air circulating oven at a predetermined temperature for a predetermined time, where the photosensitive resin coating is dried on the support. Thereafter, the support having the photosensitive resin coating thereon and a protective film which is unwound from another supply roll in the film coater are passed across a laminate roll under a predetermined pressure whereby the protective film is bonded to the photosensitive resin coating on the support, whereupon the laminate (protective film-bearing photosensitive dry film) is wound up on a take-up shaft in the film coater. Preferably, the oven temperature is 25 to 150° C., the pass time is 1 to 100 minutes, and the bonding pressure is 0.01 to 5 MPa.

The support film used in the photosensitive dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BXS® from Toray Advanced Film Co., Ltd.; E7302 and E7304 from Toyobo Co., Ltd.; Purex® G31 and Purex® G71T1 from Teijin DuPont Films Japan Ltd., and PET38×1-A3, PET38×1-V8 and PET38×1-X08 from Nippa Co., Ltd.

The protective film used in the photosensitive dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 μm, more preferably 25 to 50 μm, for consistent manufacture of photosensitive dry film, and prevention of wrapping or curling on a take-up roll.

Pattern Forming Process Using Photosensitive Dry Film

A further embodiment of the invention is a pattern forming process comprising the steps of:

(i') using the photosensitive dry film to form the photosensitive resin coating on a substrate, (ii) exposing the photosensitive resin coating to radiation to define exposed and unexposed regions, (iii) developing the exposed resin coating in a developer to dissolve away the unexposed region of the resin coating and to form a pattern of the resin coating.

In step (i'), the photosensitive dry film is used to form the photosensitive resin coating on a substrate. Specifically, the photosensitive dry film at its photosensitive resin coating is attached to a substrate to form the photosensitive resin coating on the substrate. When the photosensitive dry film is covered with the protective film, the dry film at its photosensitive resin coating is attached to a substrate after stripping the protective film therefrom, to form the photosensitive resin coating on the substrate. The dry film may be attached using a film attachment apparatus.

The film attachment apparatus is preferably a vacuum laminator. The photosensitive dry film is mounted in the film attachment apparatus where the protective film is stripped from the dry film. In the vacuum chamber kept at a predetermined vacuum, the bare photosensitive resin coating of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The assembly of the photosensitive resin coating on the substrate may be prebaked, if necessary, for facilitating photo-cure reaction of the photosensitive resin coating or enhancing the adhesion between the resin coating and the substrate. Prebake may be, for example, at 40 to 140° C. for 1 minute to 1 hour.

Like the pattern forming process using the photosensitive resin composition, the photosensitive resin coating attached to the substrate may be subjected to steps of (ii) exposing the photosensitive resin coating to radiation, (iii) developing the exposed resin coating in a developer to dissolve away the unexposed region of the resin coating and to form a pattern of the resin coating, and optionally (iv) post-curing the patterned coating. It is noted that the support of the photosensitive dry film may be removed before prebake or before PEB, by mechanical stripping or the like, depending on a particular process.

The pattern forming process using the photosensitive resin composition or photosensitive dry film facilitates to form a fine size pattern of thick film.

EXAMPLE

Examples of the invention are given below by way of illustration and not by way of limitation. Notably, the weight average molecular weight (Mw) is measured by gel permeation chromatography (GPC) versus monodisperse polystyrene standards using GPC column TSKgel Super HZM-H (Tosoh Corp.) under analytical conditions: flow rate 0.6 mL/min, tetrahydrofuran elute, and column temperature 40° C. All parts are by weight (pbw).

Compounds (S-1) to (S-7) used in Synthesis Examples are shown below.

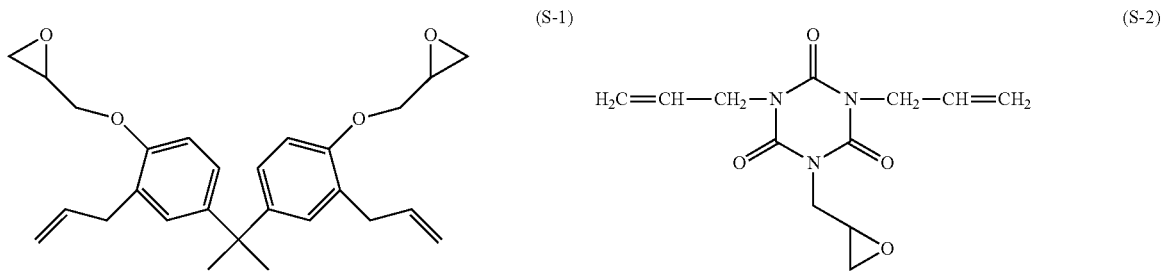

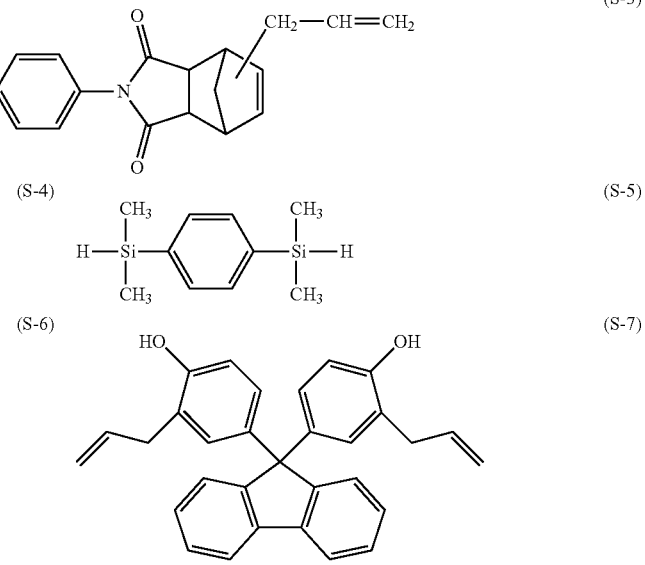

(S-3)

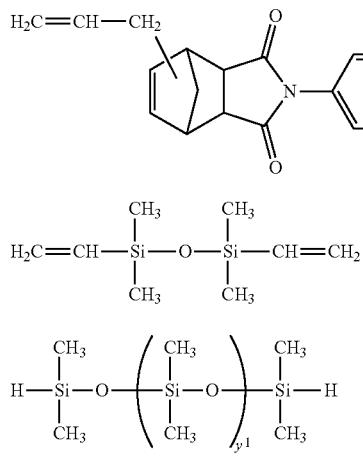

(S-4)

(S-5)

(S-6)

(S-7)

Notably, Compound (S-6) is available from Shin-Etsu Chemical Co., Ltd.

[1] Synthesis of Silicone Resins

Synthesis Example 1

Synthesis of Resin 1

A 3-L flask equipped with a stirrer, thermometer, nitrogen purge line and reflux condenser was charged with 135.5 g (0.25 mol) of Compound (S-1), 28.5 g (0.05 mol) of Compound (S-3), and 86.0 g (0.20 mol) of Compound (S-7), then with 2,000 g of toluene and heated at 70° C. Thereafter, 1.0 g of a toluene solution of chloroplatinic acid (platinum concentration 0.5 wt %) was added, and 58.2 g (0.30 mol) of Compound (S-5) and 604.0 (0.20 mol) of Compound (S-6) ($y^1$-40) were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 1. On $^1$H-NMR and $^{29}$Si-NMR spectroscopy (Bruker Corp.), Resin 1 was identified to contain recurring units (a1), (a2), (a4), (b1), (b2) and (b4). The disappearance of peaks assigned to the reactants was confirmed by GPC, proving that the synthesized polymer was in match with the ratio of reactants charged. Resin 1 had a Mw of 42,000 and a silicone content of 69.1 wt %.

Synthesis Example 2

Synthesis of Resin 2

A 3-L flask equipped with a stirrer, thermometer, nitrogen purge line and reflux condenser was charged with 26.5 g (0.10 mol) of Compound (S-2), 57.0 g (0.10 mol) of Compound (S-3), 18.6 g (0.10 mol) of Compound (S-4), and 86.0 g (0.20 mol) of Compound (S-7), then with 2,000 g of toluene and heated at 70° C. Thereafter, 1.0 g of a toluene solution of chloroplatinic acid (platinum concentration 0.5 wt %) was added, and 58.2 g (0.30 mol) of Compound (S-5) and 317 g (0.20 mol) of Compound (S-6) ($y^1$=20) were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 2. On $^1$H-NMR and $^{29}$Si-NMR spectroscopy (Bruker Corp.), Resin 2 was identified to contain recurring units (a1), (a3), (a4), (a5), (b1), (b3), (b4) and (b5). The disappearance of peaks assigned to the reactants was confirmed by GPC, proving that the synthesized polymer was in match with the ratio of reactants charged. Resin 2 had a Mw of 40,000 and a silicone content of 56.3 wt %.

Synthesis Example 3

Synthesis of Resin 3

A 3-L flask equipped with a stirrer, thermometer, nitrogen purge line and reflux condenser was charged with 66.3 g (0.25 mol) of Compound (S-2), 9.3 g (0.05 mol) of Compound (S-4), and 86.0 g (0.20 mol) of Compound (S-7), then with 2,000 g of toluene and heated at 70° C. Thereafter, 1.0 g of a toluene solution of chloroplatinic acid (platinum concentration 0.5 wt %) was added, and 58.2 g (0.30 mol) of Compound (S-5) and 604.0 g (0.20 mol) of Compound (S-6) ($y^1$=40) were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 3. On $^1$H-NMR and $^{29}$Si-NMR spectroscopy (Bruker Corp.), Resin 3 was identified to contain recurring units (a1), (a3), (a5), (b1), (b3) and (b5). The disappearance of peaks assigned to the reactants was confirmed by GPC, proving that the synthesized polymer was in match with the ratio of reactants charged. Resin 3 had a Mw of 46,000 and a silicone content of 73.3 wt %.

Synthesis Example 4

Synthesis of Resin 4

A 3-L flask equipped with a stirrer, thermometer, nitrogen purge line and reflux condenser was charged with 117.6 g (0.30 mol) of Compound (S-1), 18.6 g (0.10 mol) of Compound (S-4), and 57.0 g (0.10 mol) of Compound (S-3), then with 2,000 g of toluene and heated at 70° C. Thereafter, 1.0 g of a toluene solution of chloroplatinic acid (platinum concentration 0.5 wt %) was added, and 83.4 g (0.43 mol) of Compound (S-5) and 211.4 g (0.07 mol) of Compound (S-6) ($y^1$=40) were added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 4. On $^1$H-NMR and $^{29}$Si-NMR spectroscopy (Bruker Corp.), Resin 4 was identified to contain recurring units (a2), (a4), (a5), (b2), (b4) and (b5). The disappearance of peaks assigned to the reactants was confirmed by GPC, proving that the synthesized polymer was in match with the ratio of reactants charged. Resin 4 had a Mw of 50,000 and a silicone content of 43.3 wt %.

Comparative Synthesis Example 1

Synthesis of Resin 5

A 3-L flask equipped with a stirrer, thermometer, nitrogen purge line and reflux condenser was charged with 39.2 g (0.10 mol) of Compound (S-1), 26.5 g (0.10 mol) of Compound (S-2), 57.0 g (0.10 mol) of Compound (S-3), and 86.0 g (0.20 mol) of Compound (S-7), then with 2.000 g of toluene and heated at 70° C. Thereafter, 1.0 g of a toluene solution of chloroplatinic acid (platinum concentration 0.5 wt %) was added, and 97.0 g (0.50 mol) of Compound (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 5. Resin 5 had a Mw of 46,000 and a silicone content of 0 wt %.

Comparative Synthesis Example 2

Synthesis of Acrylic Resin 6

A flask equipped with a stirrer, thermometer, inert gas supply line and reflux condenser was charged with 70 g of propylene glycol monomethyl ether and 70 g of toluene and heated at 80° C. under nitrogen gas atmosphere. While the flask was maintained at a temperature of 80±2° C., 90 g of methyl methacrylate, 10 g of methacrylic acid, and 2,2'-azobis(isobutyronitrile) were constantly added dropwise over 4 hours. At the end of dropwise addition, stirring was continued at 80±2° C. for 6 hours, yielding a solution of Acrylic Resin 6. Acrylic Resin 6 had a Mw of 50,000.

[2] Preparation of Photosensitive Resin Composition

Examples 1 to 12 and Comparative Examples 1 to 11

Photosensitive resin compositions of Examples 1 to 12 and Comparative Examples 1 to 11 were prepared by combining components in accordance with the formulation shown in Tables 1 and 2, agitating mixing and dissolving them at room temperature.

TABLE 1

| | Component (pbw) | | Example 1 | 2 | 3 | 4 | 5 | 6 | 7 | 8 | 9 | 10 | 11 | 12 | Comparative Example 1 | 2 | 3 | 4 | 5 |
|---|---|---|---|---|---|---|---|---|---|---|---|---|---|---|---|---|---|---|---|
| (A) | Silicone resin | Resin 1 | 100 | | | 100 | 100 | 100 | 100 | 100 | 100 | 100 | 100 | | 100 | | | | |
| | | Resin 2 | | 100 | | | | | | | | | | | | | | | |
| | | Resin 3 | | | 100 | | | | | | | | | | | | | | |
| | | Resin 4 | | | | | | | | | | | | 100 | | | | | |
| | Resin | Resin 5 | | | | | | | | | | | | | | 100 | 100 | 100 | 100 |
| (B) | Carbon black | HS-100 | 40 | 40 | 40 | 40 | 40 | 40 | 15 | 70 | 1 | 160 | | 40 | | | 40 | 70 | 1 |
| | | MA8 | | | | | | | | | | | 40 | | | 40 | | | |
| (C) | Photoacid generator | PAG-1 | 1 | 1 | 1 | 1 | 5 | 1 | 1 | 1 | 1 | 1 | 1 | 1 | 1 | 1 | 1 | 1 | 1 |
| (D) | Cross-linker | CL-1 | 10 | 10 | 10 | 10 | 10 | 10 | 30 | 10 | 10 | 10 | 10 | 10 | 10 | 10 | 10 | 10 | 10 |
| (E) | Solvent | cyclo-pentanone | 55 | 55 | 55 | 55 | 55 | 55 | 55 | 55 | 55 | 55 | 55 | 55 | 55 | 55 | 55 | 55 | 55 |
| (F) | Basic compound | AM-1 | | | | | 0.2 | | | | | | | | | | | | |

TABLE 2

| | Component (pbw) | | Comparative Example 6 | 7 | 8 | 9 | 10 | 11 |
|---|---|---|---|---|---|---|---|---|
| | Resin | Acrylic resin 6 | 50 | 50 | 100 | | 50 | 50 |
| | | Acrylic resin 7 | 50 | 50 | | 100 | 50 | 50 |
| (B) | Carbon black | HS-100 | | 40 | 40 | 40 | 1 | 160 |
| | Photo-initiator | Irgacure OXE02 | 1 | 1 | 1 | 1 | 1 | 1 |
| (F) | Solvent | methyl ethyl ketone | 55 | 55 | 55 | 55 | 55 | 55 |

In Tables 1 and 2, carbon black as component (B) is as follows.

acetylene black HS-100 (average primary particle size 45 nm) by Denka Co., Ltd.

carbon black MA8 (average primary particle size 24 nm) by Mitsubishi Chemical Co., Ltd.

Photoacid generator PAG-1, crosslinker CL-1, basic compound AM-1, Acrylic Resin 7, and Irgacure OXE02 are identified below.

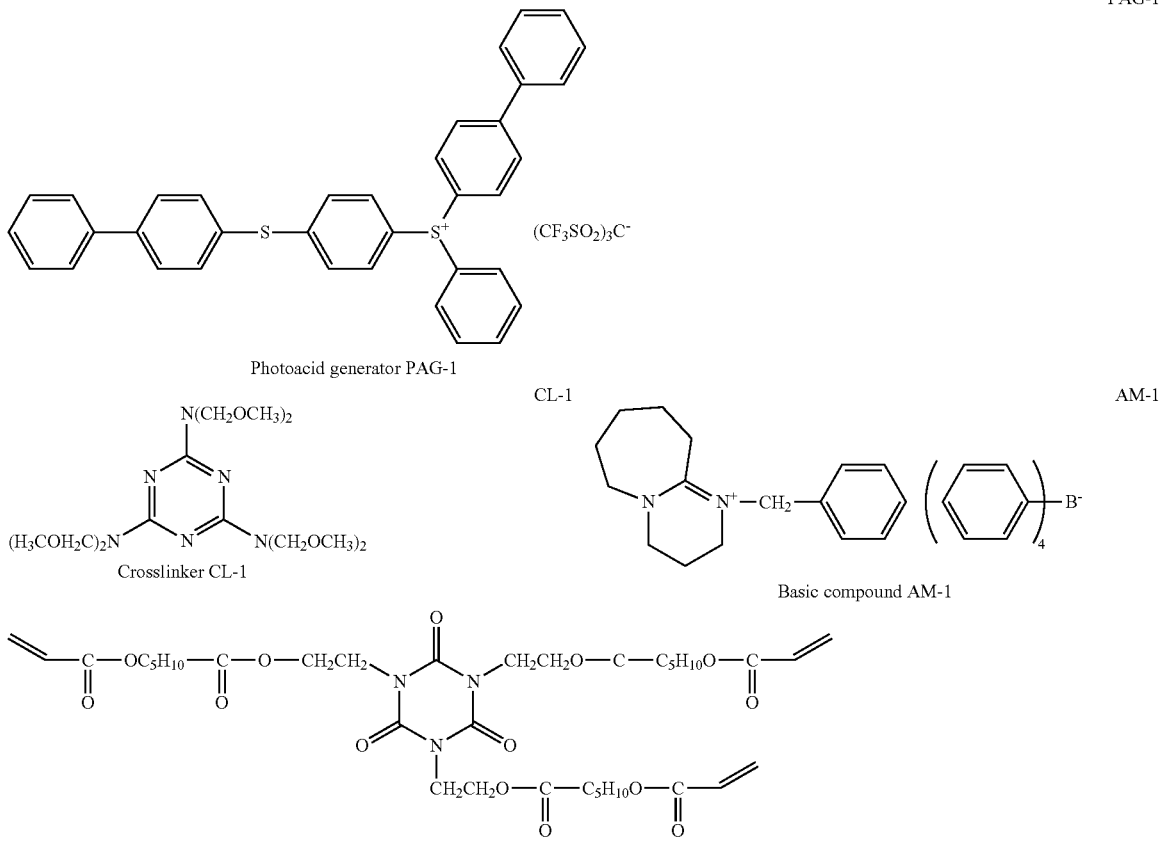

Acrylic Resin 7: rade name DPCA-20 from Nippon Kayaku Co., Ltd. (ε-caprolactone-modified dipentaerythritol acrylate)

Irgacure OXE02: ethanone, 1-[9-ethyl-6-(2-methylbenzoyl)-9H-carbazol-3-yl]-1-(O-acetyloxime) (BASF)

[3] Preparation of Photosensitive Dry Film

A die coater was used as the film coater and a polyethylene terephthalate (PET) film of 38 μm thick used as the support. Each of the photosensitive resin compositions in Tables 1 and 2 was coated onto the support. The coated support was passed through a hot air circulating oven (length 4 m) set at 100° C. over 5 minutes for drying to form a photosensitive resin coating on the support, yielding a photosensitive dry film. Using a laminating roll, a polyethylene film of 50 μm thick as the protective film was bonded to the photosensitive resin coating under a pressure of 1 MPa, yielding a protective film-bearing photosensitive dry film. The thickness of each photosensitive resin coating is tabulated in Table 3. The thickness of a resin coating was measured by an optical interference film thickness gauge.

[4] Evaluation of Resin Coating (1) Pattern Formation and Evaluation

From the protective film-bearing photosensitive dry film, the protective film was stripped off. Using a vacuum laminator TEAM-100RF (Takatori Corp.) with a vacuum chamber set at a vacuum of 80 Pa, the photosensitive resin coating on the support was closely bonded to a glass substrate. The temperature was 100° C. After restoration of atmospheric pressure, the substrate was taken out of the laminator, and the support was stripped off. Then the photosensitive resin coating was prebaked on a hot plate at 110° C. for 3 minutes for enhancing adhesion to the substrate.

Next, using a contact aligner exposure tool, the photosensitive resin coating was exposed to radiation of 365 nm through a mask having a line-and-space pattern and a contact hole pattern. After exposure, the coated substrate was baked (PEB) on a hot plate at 120° C. for 3 minutes and cooled. This was followed by spray development in propylene glycol monomethyl ether acetate (PGMEA) for 300 seconds for forming a pattern of the resin coating.

The patterned photosensitive resin coating on the substrate was post-cured in an oven at 190° C. for 2 hours while the oven was purged with nitrogen. Under a scanning electron microscope (SEM), the contact hole patterns of 50 μm, 30 μm, 20 μm, 10 μm, and 5 μm were observed in cross section, with the minimum hole pattern in which holes extended down to the film bottom being reported as maximum resolution. From the cross-sectional photo, the contact hole pattern of 50 μm was evaluated for perpendicularity, and rated "⊚ (excellent)" for perpendicular pattern. "○ (good)" for slightly inversely tapered profile, "Δ (fair)" for inversely tapered profile, and "x (poor)" for opening failure.

(2) Evaluation of Reliability (Adhesion, Crack Resistance)

Each of the photosensitive resin coating-bearing substrates after pattern formation and post-cure in Test (1) was cut into specimens of 10 mm squares using a dicing saw with a dicing blade (DAD685 by DISCO Co., spindle revolution 40,000 rpm, cutting rate 20 mm/sec). Ten specimens for each Example were examined by a thermal cycling test (test of holding at −25° C. for 10 minutes and holding at 125° C. for 10 minutes, the test being repeated 1,000 cycles). After the test, it was observed whether or not the resin coating peeled from the substrate and whether or not the resin coating cracked. The sample was rated "good" when all specimens did not peel or crack, "peeled" when one or more specimens peeled, and "cracked" when one or more specimens cracked.

(3) Flexibility Test

The film was wound on a spindle of diameter 5 mm, held for 10 seconds, and unwound. The winding/unwinding operation was repeated 10 times, after which the film was inspected for anomaly. An intact sample was rated "○ (good)" and a cracked or defective sample was rated "x (poor)".

(4) Light-Shielding Test

Using a Mask Aligner MA8 (SUSS MicroTec AG), the resin coating laminated on a glass wafer was exposed over its entire surface (i.e., not through a mask) to light of wavelength 360 nm from a high-pressure mercury lamp. The film was PEB and dipped in PGMEA. The resin film which remained after these operations was then heated in an oven at 190° C. for 2 hours, yielding a cured film. The cured film was measured for transmittance of light of wavelength 450 nm, using spectrophotometer U-3900H (Hitachi High-Tech Science Corp.).

Tables 3 and 4 show the test results of resin coatings of the photosensitive resin compositions in Tables 1 and 2.

As is evident from the results, the photosensitive resin compositions within the scope of the invention have good reliability with respect to adhesion and crack resistance, resolution, and flexibility. The cured films thereof have satisfactory light shielding properties in thin film form.

Japanese Patent Application No. 2018-134210 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising (A) a base resin comprising an acid crosslinkable group-containing silicone resin, (B) carbon black, and (C) a photoacid generator,
wherein the acid crosslinkable group is a phenolic hydroxyl group or epoxy group,
wherein the silicone resin comprises recurring units having the formula (a1) and recurring units having the formula (b1):

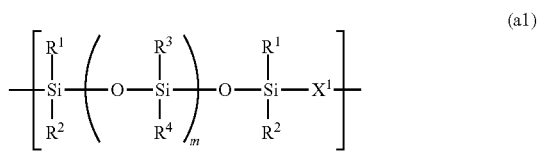

TABLE 3

| | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Resin layer thickness (μm) | 10 | 10 | 10 | 10 | 10 | 10 | 10 | 10 | 10 | 10 | 10 | 10 |
| Contact hole pattern shape | ○ | ○ | ○ | ⊚ | ○ | ○ | ○ | ○ | ○ | ○ | ○ | ○ |
| Maximum resolution (μm) | 10 | 10 | 10 | 10 | 10 | 10 | 5 | 20 | 5 | 20 | 10 | 10 |
| Transmittance of cured film @ 450 nm (%) | 0.0 | 0.0 | 0.0 | 0.0 | 0.0 | 0.0 | 0.0 | 0.0 | 1.0 | 0.0 | 0.0 | 0.0 |
| Reliability Peel | Good | Good | Good | Good | Good | Good | Good | Good | Good | Good | Good | Good |
| Crack | Good | Good | Good | Good | Good | Good | Good | Good | Good | Good | Good | Good |
| Flexibility | ○ | ○ | ○ | ○ | ○ | ○ | ○ | ○ | ○ | ○ | ○ | ○ |

TABLE 4

| | Comparative Example | | | | | | | | | | |
|---|---|---|---|---|---|---|---|---|---|---|---|
| | 1 | 2 | 3 | 4 | 5 | 6 | 7 | 8 | 9 | 10 | 11 |
| Resin layer thickness (μm) | 10 | 10 | 10 | 10 | 10 | 10 | 10 | 10 | 10 | 10 | 10 |
| Contact hole pattern shape | ○ | X | Δ | Δ | Δ | Δ | X | X | X | Δ | X |
| Maximum resolution (μm) | 5 | — | 50 | 50 | 30 | 50 | — | — | — | 50 | — |
| Transmittance of cured film @ 450 nm (%) | 70.2 | 0.0 | 0.0 | 0.0 | 1.0 | 100.0 | 0.0 | 0.0 | 1.0 | 2.4 | 0.0 |
| Reliability Peel | peeled | peeled | peeled | peeled | peeled | peeled | peeled | peeled | peeled | peeled | peeled |
| Crack | cracked | cracked | cracked | cracked | cracked | cracked | cracked | cracked | cracked | cracked | cracked |
| Reliability | ○ | X | X | X | X | X | X | X | X | X | X |

-continued

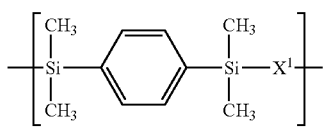
(b1)

wherein $R^1$ to $R^4$ are each independently a $C_1$-$C_8$ monovalent hydrocarbon group, m is an integer of 0 to 600, and $X^1$ is a divalent group having the formula (X1):

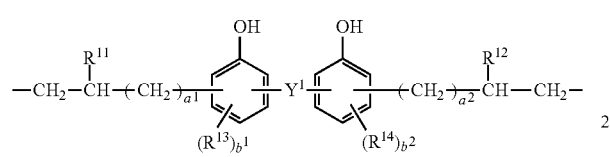
(X1)

wherein $Y^1$ is a single bond, methylene, propane-2,2-diyl, 1,1,1,3,3,3-hexafluoropropane-2,2-diyl or fluorene-9,9-diyl group, $R^{11}$ and $R^{12}$ are each independently hydrogen or methyl, $R^{13}$ and $R^{14}$ are each independently a $C_1$-$C_4$ alkyl or $C_1$-$C_4$ alkoxy group, $a^1$ and $a^2$ are each independently an integer of 0 to 7, $b^1$ and $b^2$ are each independently an integer of 0 to 2.

2. The photosensitive resin composition of claim 1 wherein the silicone resin comprises recurring units having the formula (a1), recurring units having the formula (b1), recurring units having the formula (a2), and recurring units having the formula (b2):

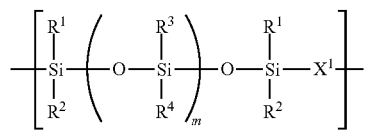
(a1)

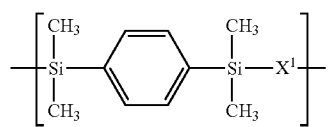
(b1)

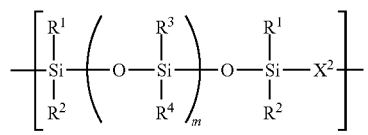
(a2)

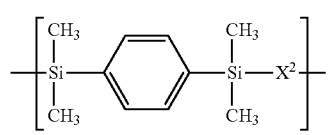
(b2)

wherein $R^1$ to $R^4$ are each independently a $C_1$-$C_8$ monovalent hydrocarbon group, m is an integer of 0 to 300, $X^1$ is a divalent group having the formula (X1):

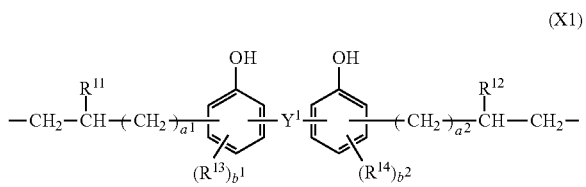
(X1)

wherein $Y^1$ is a single bond, methylene, propane-2,2-diyl, 1,1,1,3,3,3-hexafluoropropane-2,2-diyl or fluorene-9,9-diyl group, $R^{11}$ and $R^{12}$ are each independently hydrogen or methyl, $R^{13}$ and $R^{14}$ are each independently a $C_1$-$C_4$ alkyl or $C_1$-$C_4$ alkoxy group, $a^1$ and $a^2$ are each independently an integer of 0 to 7, $b^1$ and $b^2$ are each independently an integer of 0 to 2, $X^2$ is a divalent group having the formula (X2):

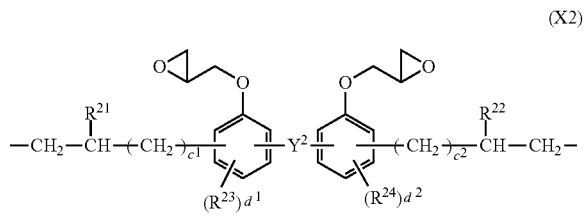
(X2)

wherein $Y^2$ is a single bond, methylene, propane-2,2-diyl, 1,1,1,3,3,3-hexafluoropropane-2,2-diyl or fluorene-9,9-diyl group, $R^{21}$ and $R^{22}$ are each independently hydrogen or methyl, $R^{23}$ and $R^{24}$ are each independently a $C_1$-$C_4$ alkyl or $C_1$-$C_4$ alkoxy group, $c^1$ and $c^2$ are each independently an integer of 0 to 7, $d^1$ and $d^2$ are each independently an integer of 0 to 2.

3. The photosensitive resin composition of claim 1 wherein the silicone resin further comprises recurring units having the formula (a3) and recurring units having the formula (b3):

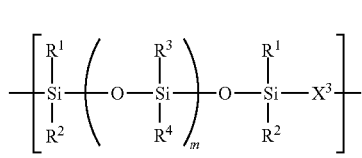
(a3)

(b3)

wherein $R^1$ to $R^4$ and m are as defined above, and $X^3$ is a divalent group having the formula (X3):

(X3)

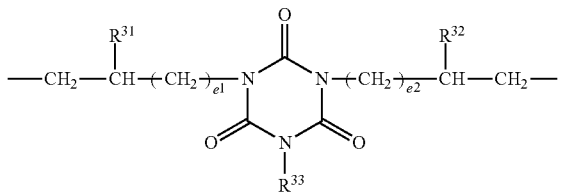

wherein $R^{31}$ and $R^{32}$ are each independently hydrogen or methyl, $e^1$ and $e^2$ are each independently an integer of 0 to 7, and $R^{33}$ is a $C_1$-$C_8$ monovalent hydrocarbon group which may contain an ester bond or ether bond, or a monovalent group having the formula (X3-1):

(X3-1)

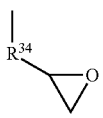

wherein $R^{34}$ is a $C_1$-$C_8$ divalent hydrocarbon group which may contain an ester bond or ether bond.

4. The photosensitive resin composition of claim 1 wherein the silicone resin further comprises recurring units having the formula (a4) and recurring units having the formula (b4):

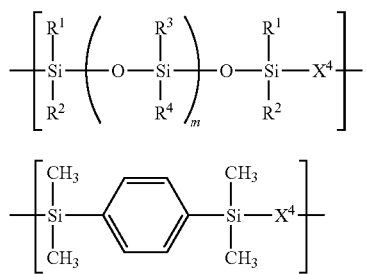

(a4)

(b4)

wherein $R^1$ to $R^4$ and m are as defined above, and $X^4$ is a divalent group having the formula (X4):

(X4)

wherein $Z^1$ is a divalent organic group, $R^{41}$ and $R^{42}$ are each independently hydrogen or a $C_1$-$C_8$ monovalent hydrocarbon group in which some or all hydrogen may be substituted by halogen, $R^{43}$ and $R^{44}$ are each independently a $C_1$-$C_8$ alkanediyl group, $R^{x1}$ and $R^{x2}$ are each independently a single bond or a group to cyclize with $R^{x3}$ or $R^{x4}$ to form a ring structure, $R^{x3}$ and $R^{x4}$ are each independently hydrogen or a $C_1$-$C_8$ monovalent hydrocarbon group, or $R^{x3}$ or $R^{x4}$ is a single bond or a $C_1$-$C_{10}$ divalent hydrocarbon group when $R^{x3}$ or $R^{x4}$ cyclizes with $R^{x1}$ or $R^{x2}$ to form a ring structure.

5. The photosensitive resin composition of claim 1 wherein the silicone resin further comprises recurring units having the formula (a5) and recurring units having the formula (b5):

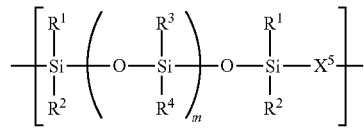

(a5)

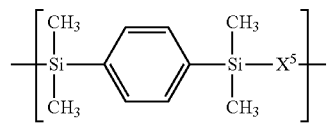

(b5)

wherein $R^1$ to $R^4$ and m are as defined above, and $X^5$ is a divalent group having the formula (X5):

(X5)

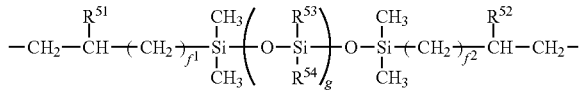

wherein $R^{51}$ and $R^{52}$ are each independently hydrogen or methyl, $R^{53}$ and $R^{54}$ are each independently a $C_1$-$C_8$ monovalent hydrocarbon group, $f^1$ and $f^2$ are each independently an integer of 0 to 7, and g is an integer of 0 to 600.

6. The photosensitive resin composition of claim 1, containing 0.01 to 60% by weight of the carbon black (B).

7. The photosensitive resin composition of claim 1, further comprising (D) a crosslinker.

8. The photosensitive resin composition of claim 7 wherein the crosslinker is selected from the group consisting of melamine, guanamine, glycoluril and urea compounds having on the average at least two methylol and/or alkoxymethyl groups in the molecule, amino condensates modified with formaldehyde or formaldehyde-alcohol, phenol compounds having on the average at least two methylol or alkoxymethyl groups in the molecule, and epoxy compounds having on the average at least two epoxy groups in the molecule.

9. The photosensitive resin composition of claim 1, further comprising (E) a solvent.

10. The photosensitive resin composition of claim 1, further comprising (F) a quencher.

11. A photosensitive resin coating obtained from the photosensitive resin composition of claim 1.

12. A photosensitive dry film comprising a support and the photosensitive resin coating of claim 11 thereon.

13. A pattern forming process comprising the steps of:
(i') using the photosensitive dry film of claim 12 to form the photosensitive resin coating on a substrate,
(ii) exposing the photosensitive resin coating to radiation to define exposed and unexposed regions, and
(iii) developing the exposed resin coating in a developer to dissolve away the unexposed region of the resin coating and to form a pattern of the resin coating.

14. The pattern forming process of claim 13, further comprising (iv) post-curing the patterned resin coating resulting from development step (iii) at a temperature of 100 to 250° C.

15. A black matrix comprising the photosensitive resin coating of claim 11.

16. A pattern forming process comprising the steps of:
(i) coating the photosensitive resin composition of claim 1 onto a substrate to form a photosensitive resin coating thereon,
(ii) exposing the photosensitive resin coating to radiation to define exposed and unexposed regions, and
(iii) developing the exposed resin coating in a developer to dissolve away the unexposed region of the resin coating and to form a pattern of the resin coating.

17. The photosensitive resin composition of comprising (A) a base resin comprising an acid crosslinkable group-containing silicone resin, (B) carbon black, and (C) a photoacid generator, wherein the acid crosslinkable group is a phenolic hydroxyl group or epoxy group, wherein the silicone resin comprises recurring units having the formula (a2) and recurring units having the formula (b2):

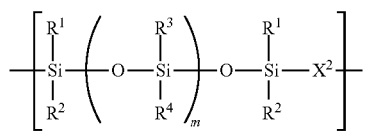

(a2)

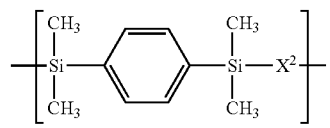

(b2)

wherein $R^1$ to $R^4$ are each independently a $C_1$-$C_8$ monovalent hydrocarbon group, m is an integer of 0 to 600, and $X^2$ is a divalent group having the formula (X2):

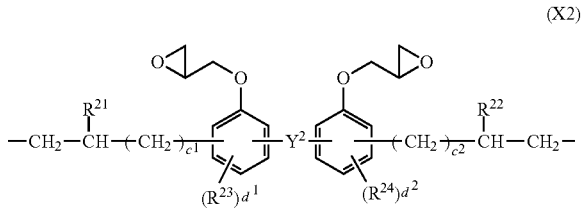

(X2)

wherein $Y^2$ is a single bond, methylene, propane-2,2-diyl, 1,1,1,3,3,3-hexafluoropropane-2,2-diyl or fluorene-9,9-diyl group, $R^{21}$ and $R^{22}$ are each independently hydrogen or methyl, $R^{23}$ and $R^{24}$ are each independently a $C_1$-$C_4$ alkyl or $C_1$-$C_4$ alkoxy group, $c^1$ and $c^2$ are each independently an integer of 0 to 7, $d^1$ and $d^2$ are each independently an integer of 0 to 2.

* * * * *